United States Patent
Frans et al.

(10) Patent No.: US 10,468,544 B2
(45) Date of Patent: *Nov. 5, 2019

(54) SYNCHRONOUS WIRED-OR ACK STATUS FOR MEMORY WITH VARIABLE WRITE LATENCY

(71) Applicant: Rambus Inc., Sunnyvale, CA (US)

(72) Inventors: Yohan Frans, Palo Alto, CA (US); Simon Li, Cupertino, CA (US); Eric Linstadt, Palo Alto, CA (US); Jun Kim, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 15/369,244

(22) Filed: Dec. 5, 2016

(65) Prior Publication Data

US 2017/0147234 A1 May 25, 2017

Related U.S. Application Data

(63) Continuation of application No. 13/804,334, filed on Mar. 14, 2013, now Pat. No. 9,515,204.

(60) Provisional application No. 61/680,611, filed on Aug. 7, 2012.

(51) Int. Cl.
*G06F 12/02* (2006.01)
*H01L 31/0236* (2006.01)
*G06F 13/16* (2006.01)
*G06F 3/06* (2006.01)
(Continued)

(52) U.S. Cl.
CPC ...... *H01L 31/02366* (2013.01); *G06F 3/0613* (2013.01); *G06F 3/0626* (2013.01); *G06F 3/0658* (2013.01); *G06F 3/0659* (2013.01); *G06F 3/0679* (2013.01); *G06F 12/0246* (2013.01); *G06F 13/1684* (2013.01); *G06F 13/372* (2013.01); *G06F 12/00* (2013.01); *G06F 13/16* (2013.01); *Y02D 10/14* (2018.01)

(58) Field of Classification Search
CPC ................................. G06F 12/00; G06F 13/16
See application file for complete search history.

(56) References Cited

U.S. PATENT DOCUMENTS

| | | | | | |
|---|---|---|---|---|---|
| 3,548,382 | A | * | 12/1970 | Lichty | G06F 13/18 710/317 |
| 5,764,927 | A | * | 6/1998 | Murphy | G05B 19/0423 710/105 |
| 9,515,204 | B2 | * | 12/2016 | Frans | G06F 12/0246 |

(Continued)

*Primary Examiner* — Charles Rones
*Assistant Examiner* — Tian-Pong Chang
(74) *Attorney, Agent, or Firm* — Lowenstein Sandler LLP

(57) ABSTRACT

A memory controller comprises a command interface to transmit a memory command to a plurality of memory devices associated with the memory controller. The memory controller also comprises an acknowledgement interface to receive an acknowledgment status packet from the plurality of memory devices over a shared acknowledgement link coupled between the memory controller and the plurality of memory devices, the acknowledgement status packet indicating whether the command was received by the plurality of memory devices. In addition, the memory controller comprises a memory controller core to decode the acknowledgment status packet to identify a portion of the acknowledgment status packet corresponding to each of the plurality of memory devices.

20 Claims, 18 Drawing Sheets

(51) Int. Cl.
*G06F 13/372* (2006.01)
*G06F 12/00* (2006.01)

(56) References Cited

U.S. PATENT DOCUMENTS

| | | | |
|---|---|---|---|
| 2002/0118593 A1* | 8/2002 | Takemae | G06F 13/1694 365/233.1 |
| 2004/0052258 A1* | 3/2004 | Robertson | G06F 13/22 370/392 |
| 2008/0040559 A1* | 2/2008 | Wolford | G06F 13/1647 711/150 |
| 2010/0034025 A1 | 2/2010 | Yanagidaira et al. | |
| 2010/0262767 A1* | 10/2010 | Borchers | G06F 12/0246 711/103 |
| 2011/0138261 A1* | 6/2011 | Bains | G06F 11/1016 714/800 |
| 2011/0238740 A1* | 9/2011 | Yu | H04L 41/0213 709/203 |
| 2011/0258366 A1 | 10/2011 | Schuetz et al. | |
| 2011/0264846 A1 | 10/2011 | Oh | |
| 2013/0009318 A1* | 1/2013 | Chia | H01L 25/0657 257/774 |
| 2013/0339638 A1* | 12/2013 | Lazmi | G06F 13/1684 711/156 |

\* cited by examiner

SYNCHRONOUS WIRED-OR ACK STATUS FOR MEMORY WITH VARIABLE WRITE LATENCY

RELATED APPLICATIONS

This application is a continuation of U.S. patent application Ser. No. 13/804,334, filed Mar. 14, 2013, which claims the benefit of U.S. Provisional Patent Application No. 61/680,611, filed Aug. 7, 2012, which is hereby incorporated by reference herein.

BRIEF DESCRIPTION OF THE DRAWINGS

The present disclosure is illustrated by way of example, and not by way of limitation, in the figures of the accompanying drawings.

DETAILED DESCRIPTION

1 Introduction

New non-volatile memory (e.g. resistive random-access memory (RRAM)) has significantly shorter latency for a write command (WRITE latency) compared to NAND-Flash. However, when using non-volatile memory, a successful WRITE operation is not always guaranteed and the latency of a successful WRITE operation is variable.

At the system level, WRITE throughput can be improved by interleaving WRITEs to multiple non-volatile memory (NVM) devices. Alternative methods of transmitting a WRITE status acknowledgement (ACK) to the NVM controller can use one ACK pin per device, which increases system cost (e.g., increases the pin count), an asynchronous ACK per device that is wired-OR'd with ACKs from many devices, which assumes all devices are busy when one device is busy (i.e., a performance penalty), or use a polling status bit in the NVM device, which can also lead to a performance penalty. The present disclosure presents still another alternative for WRITE status acknowledgement, which is believed to enable lower pin count ACKs and high performance.

Embodiments of an Advanced Random Access Memory (ARAM) interface architecture that includes the ACK channel and other novel features are described herein. The ARAM interface architecture is designed, in at least one embodiment, to enable the deployment of high-performance, low-latency, low-power, low pin count, low cost, non-volatile memory and storage subsystems.

Figure 1:
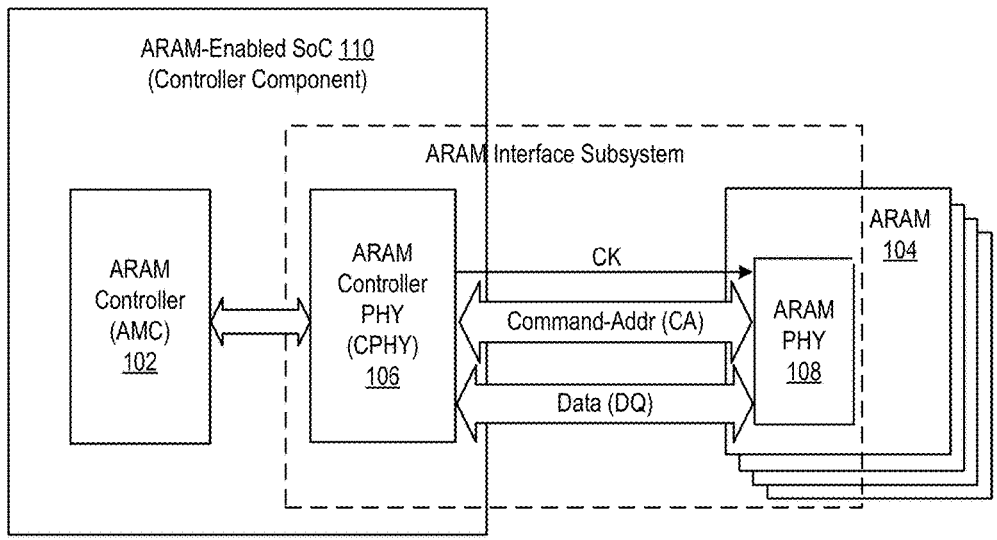
FIG. 1 illustrates an ARAM Interface Subsystem Overview, according to an embodiment.

FIG. 1 illustrates an ARAM Interface Subsystem Overview, according to an embodiment. An ARAM interface architecture includes the technology utilized to connect an ARAM Controller (AMC) 102, at the link or media access control (MAC) layer interface, to an equivalent link/MAC layer interface in one or more ARAM non-volatile memory devices 104. The AMC 102 may be referred to herein as the "memory controller core." The scope of this interface architecture includes the ARAM Controller PHY and IO cells (referred to subsequently as the CPHY) 106 and the ARAM device PHY and IO cells (ARAM PHY, or APHY) 108. A System-on-Chip (SoC) 110, containing the CPHY and the AMC (or other memory controller), will often be referred to as the "Controller Component", "ARAM Controller", or "memory controller".

In one embodiment, the ARAM CPHY 106 and APHY 108 communicate with each other across a high-speed Very Low Swing-Near Ground (VLS-NG) signaling interface. VLS-NG signaling operates in one design at speeds of up to 2 Gbps, using very low voltage swings in order to minimize power. A reference clock (CK) and command-address (CA) and data (DQ) lanes all utilize the VLS-NG technology, while standard rail-to-rail CMOS signaling may be used for chip enable (EN) lanes. An acknowledge/status (ACK) lane may use open-drain signaling.

In one embodiment, the CA lanes are utilized to deliver command and address packets from the CPHY 106 to the ARAM devices 104, while the DQ lanes carry read and write data between the two. The number of CA and DQ lanes used to communicate between the CPHY and the ARAMs are scalable parameters of the interface architecture. The number of CA and DQ lanes implemented may be dependent upon the quantity and width of the ARAM devices and the required CA and DQ bandwidth. In one embodiment, the CPHY is sized to support the appropriate number of CA and DQ lanes for each system. All CA and DQ data transfers may be synchronous, meaning that they are referenced to CK transitions. The FlexPhase architecture from Rambus may allow an extended range of per-pin transmit and receive data phases for the DQ lanes, thereby eliminating the need for data strobes and mitigating trace-length matching requirements, which minimizes complexity, reduces signaling power, and eases the PCB layout constraints.

1.1 Features

The following are some features of the ARAM interface architecture described herein.

- Differential forwarded clock
- Double-Data-Rate (DDR) DQ lanes
- Single-Data-Rate (SDR) CA lanes
- Per-Rank Enable (EN) link for efficient power management
- Sideband ACK link for status and reporting of exceptional conditions
- Dynamic Width control and configuration support for capacity expansion without bandwidth degradation.
- Utilizes power efficient Very Low Swing-Near Ground (VLS-NG) signaling
- FlexPhase architecture for power efficiency and precise per-lane phase alignment of the DQ links
- Mitigates system trace length matching requirements

2.1 Interface Architecture Overview

This section provides an overview of the ARAM interface architecture. It presents an initial discussion on definitions utilized in this disclosure as well as a further discussion on the IOs, signaling, features, transactions, configurations and systems topologies supported by the interface architecture

2.2 Pin Definitions

The ARAM interface utilizes the following pin types for normal operation:

TABLE 1

| Pin Usage | | |
|---|---|---|
| Name | Type | Usage |
| CK/CKB | Diff VLS-NG | Differential Clock for ARAM subsystem |
| CA | Single ended VLS-NG | Command and Address |
| DQ | Single ended VLS-NG | Read and Write Data |
| ACK | Pseudo Open Drain | Command Status and Acknowledgement |
| EN | CMOS | Device Enable |
| VEXT | Reference Voltage | Output Reference Voltage |
| VDD/GND | Power | Interface Power Supply |

2.3 Logical Term Definitions

In one embodiment, an ARAM Memory Controller (AMC) communicates with an ARAM Device through an ARAM interface channel. This channel is defined to contain lanes, links, and ranks. The AMC utilizes the ARAM Controller PHY (CPHY) to communicate through the channel, while the ARAM device uses an ARAM PHY.

Within a channel, each physically and logically independent signal (or signals) is referred to as a lane. For example, the differential signal pair CK and CKB can be referred to as the CK lane. Each logically independent CA or DQ signal is a single-ended lane.

One or more logically related lanes can be grouped together and be referred to as a link. For example, if two CA lanes form the means of communicating commands on a given channel, they would constitute the CA link for that channel. Similarly, logically related DQ lanes are combined to form a DQ link.

Multiple ARAM devices may be attached to a single DQ link. If multiple ARAM devices are attached to the same set of DQ lanes within a link, the ARAM devices must be in different ranks. As each rank is enabled/disabled by its individual EN lane, the controller is able to effectively manage which rank is drawing power and can service its requests. In one embodiment, the CK, EN, CA, DQ, and ACK links are combined to form a single channel.

Figure 2:
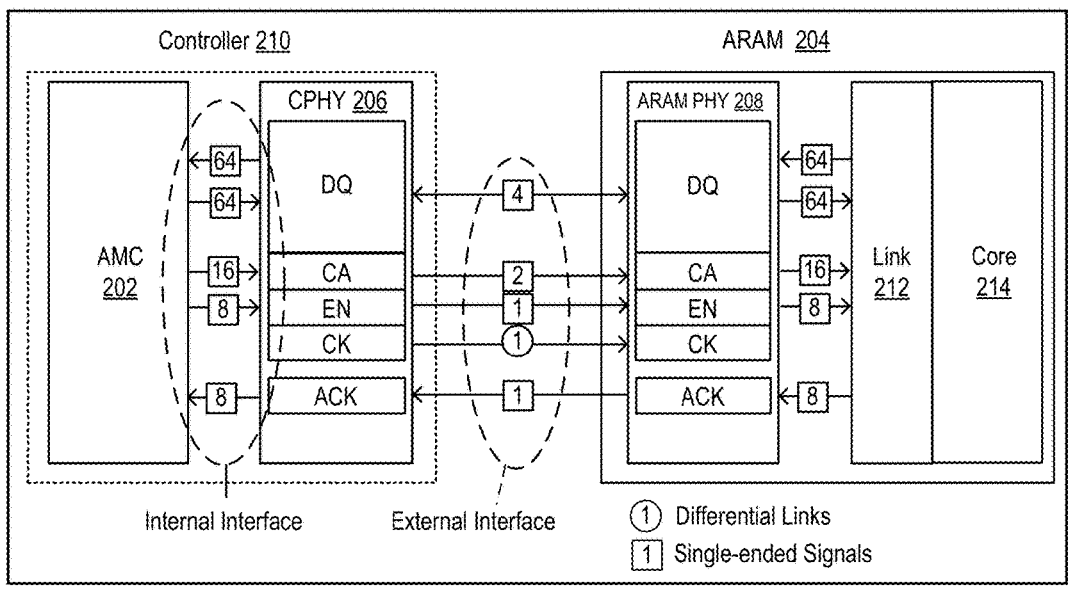
FIG. 2 illustrates a sample ARAM System Block Diagram, according to an embodiment.

For example, as illustrated in FIG. 2, a single device ARAM x4 channel may have a differential CK lane, a 2-lane wide CA link, a 4-lane wide DQ link, an EN lane, and an ACK lane. Each DQ lane in the ARAM x4 channel may be able to transmit and receive data at up to 2 Gbps, for a total bandwidth of 1 GB/s.

2.4 Dynamic Width

The ARAM interface architecture feature called Dynamic Width enables additional capacity, without the additional loading and signaling limitations of simply adding ranks to increase capacity. Dynamic Width allows multiple ARAM devices to be attached to a DQ link by distributing them across subsets of DQ lanes within the link. To identify individual devices, a sub-address field within the CA packet protocol is used to indicate the intended target. This method avoids the overhead of providing a per-device chip select lane on the controller.

2.5 Sample System Configuration

FIG. 2 contains a block diagram of a sample ARAM system configuration, according to an embodiment. In one embodiment, this configuration consists of a controller component 210 (AMC 202 and its CPHY 206) and a single x4 ARAM device 204 (ARAM PHY 208, link layer 212, and core 214), with an ARAM interface channel forming the communication means between the two. This illustrated configuration utilizes 2 CA lanes and 4 DQ lanes, providing 0.25 GB/s of CA bandwidth and 1 GB/s of DQ bandwidth when the data rates of 1 Gb/s for the CAs and 2 Gb/s for the DQs are used alongside a 1 GHz CK link. One ACK link serves as the status link back from the device in this configuration, and a single EN lane is used to enable the target device. Details of the appropriate protocol, signaling, and topology (for multiple ARAM device channels) are dependent upon the specific characteristics of the ARAM device, and additional controller and system constraints.

In addition to the signals in the ARAM interface channel, there are two other interfaces within the subsystem: one which connects the AMC 202 to the CPHY 206, and one which connects the ARAM PHY 208 with Link Layer 212. The signal counts shown on the internal interfaces illustrate the key busses used at these interfaces, but do not show the complete set of all signals needed between the AMC and CPHY as well as between the ARAM Link Layer and PHY, as these are implementation dependent and not directly relevant to the present disclosure. In one embodiment, additional external signals may be needed, based on the exact system configuration selected. In normal operation, command packets from the AMC are serialized by the CPHY and sent to the ARAM across the CA link. Preamble and postamble fields may be used to frame these CA packets. The CA packets themselves can include device address mask fields in order to direct commands to specific subsets of the attached ARAM devices. Similarly, write and read data to and from the ARAM device are serialized onto the bidirectional DQ link.

Note that the number of CA lanes is a flexible architectural parameter, and can be scaled depending upon the total required command/address link bandwidth, command/address transport latency, and ARAM or controller pin count constraints. Similarly, the number of native DQ lanes is also a flexible architectural parameter.

TABLE 2

ARAM Interface Configurations

| Feature Class | Features Supported by Architecture | Recommended Features ARAMs | ARAM Memory Controllers |
|---|---|---|---|
| CA Width | x1/x2 | x2 | application dependent |
| Native DQ Width | x4/x8 | x4 ARAM | application dependent |
| Dynamic DQ Width | x4 ARAM: x4, x2, x1 x8 ARAM: x8, x4, x2, x1 | x4 ARAM: x4, x2 | N/A |

2.6 ARAM Interface Architecture Features
2.6.1 Operating Frequency

The ARAM system architecture is intended to operate in a wide range of CA and DQ bit rates. It is initially targeted to provide a 1 GB/s DQ link (using 4 DQ lanes) with a 1 GHz forwarded clock (CK). The frequency of the ARAM controller and ARAM core supporting 2 Gbps DQ data rate is presumed to be 125 MHz. Consequently, the DQ serialization ratio at the link layer interface for both the CPHY and the ARAM PHY is 16:1. As the CA lanes transfer data at 1 Gbps, the CA serialization ratio is 8:1. Note that in the ARAM system architecture, in order to minimize controller and device pin count while maintaining channel bandwidth, the total number of loads on the DQ bus is limited.

2.6.2 Link Definitions

Links in the ARAM system architecture channel are utilized as follows. (Note that CK, CA, and DQ links use VLS-NG signaling levels).

CK link: The differential clock link (consisting of the CK and CKB signals) is driven from the CPHY to the ARAM devices. All CA and DQ transfers are referenced to CK transitions, as are the ACK packets. The (nominally) 1 GHz clock is generated by the CPHY's PLL and is a multiplied version of the reference clock (125 MHz nominal) feeding the PLL.

CA link: The CA link carries command and address information from the CPHY to all the ARAM devices connected to the interface channel (up to 4 devices at maximum data rate). The architecture supports a x1 and a x2 CA link. The link operates at a per-pin-data rate equal to the CK link frequency (e.g. a 1 GHz CK translates to a 1 Gbps CA per-pin data rate). A discussion of the command protocol can be found in section 4.1.

EN link: This link is used to enable the ARAM device, specifically, its PHY and Link Layer. In order to successfully send and receive high speed VLS-NG signals across the CK, CA, DQ, and ACK links, EN must be asserted prior to and throughout the duration of the ARAM operation. To minimize channel pin count, all devices within the same rank can receive the same EN signal lane. Its proper use enables the multi-rank topology, which is useful for capacity expansion. The EN signal is presumed to be asynchronous, and is the only signal within the channel that uses full-swing CMOS signaling in normal operation.

DQ link: The bidirectional DDR DQ link carries data between the controller and the ARAMs. Four-bit and 8-bit wide DQ links are supported. Alongside a forwarded-clock topology, FlexPhase technology is used to maximize READ and WRITE timing margins for the DQ lanes.

ACK link: is used to return routine status information and exceptional condition notification from the ARAM devices to the CPHY. The specific interconnect, signaling, protocol, and timing appropriate for the ARAM device characteristics is discussed in the ACK section of this disclosure.

2.6.3 ARAM Interface Architecture IOs

Figure 3:
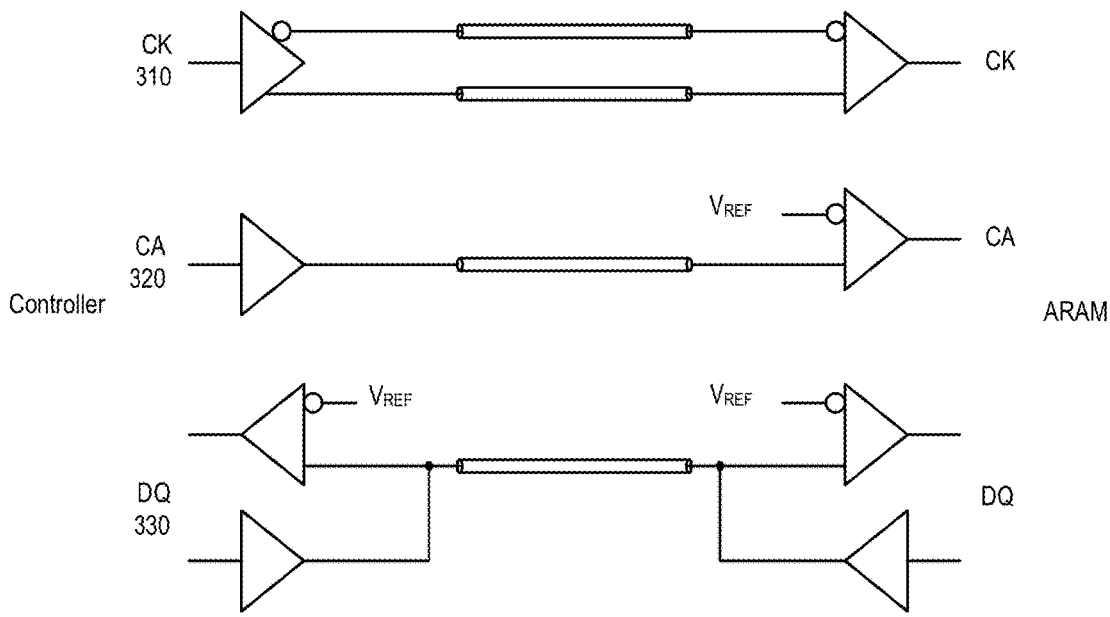
FIG. 3 illustrates ARAM High-Speed IO Circuits, according to an embodiment.

The controller and ARAM IO cells may utilize a very low swing-near ground differential driver and receiver for the clock link. Very low swing-near ground, single-ended drivers and receivers may be used for the DQ and CA lanes. At 2 Gb/s with 2 loads per DQ lane, the receivers are unterminated to minimize signaling power. FIG. 3 shows how these high-speed IOs are connected for the CK 310, CA 320, and DQ 330 links, according to one embodiment. In this embodiment, the DQ lanes are bidirectional, while the CA and CK lanes are unidirectional from the controller to the ARAM.

2.6.4 VLS-NG Signaling

As noted, the ARAM interface channel utilizes Very Low Swing-Near Ground signaling (VLS-NG) for its high-speed IO links, in order to optimize power consumption. This signaling technology uses a voltage supplied by the controller, VEXT, as reference for the VOH signal level. The range of VEXT/VOH is expected to be 250-350 mV, while VOL is defined as 0 mV.

Figure 4:
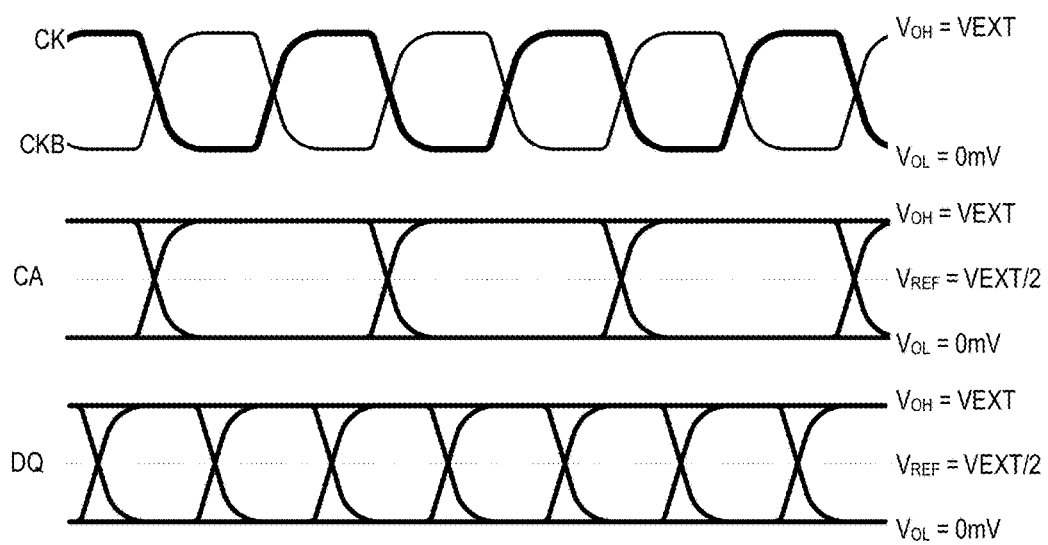
FIG. 4 illustrates Very Low Swing-Near Ground Signaling (VLS-NG), according to an embodiment.

For the single-ended signals within the channel, a reference voltage is utilized as the receiver sampling threshold and is set to VREF=VEXT/2. For the differential CK link, a differential peak-to-peak signal swing of 2*VOH is utilized. FIG. 4 provides a graphic representation of the voltage waveforms present on the VLS-NG links.

The FlexPhase technology allows for different timing on each of the DQ lanes. These links are individually calibrated, internal to the CPHY, in order to provide optimal timing of the eye relative to CK. The CPHY contains circuitry to calibrate the DQ lanes in both the write and read directions. Consequently, the externally observed timing of CK relative to DQ is not necessarily as shown in FIG. 4, which depicts the timing as seen at the samplers in the ARAM, or in the CPHY after link calibration.

2.6.5 ARAM Interface Transactions

Figure 5:
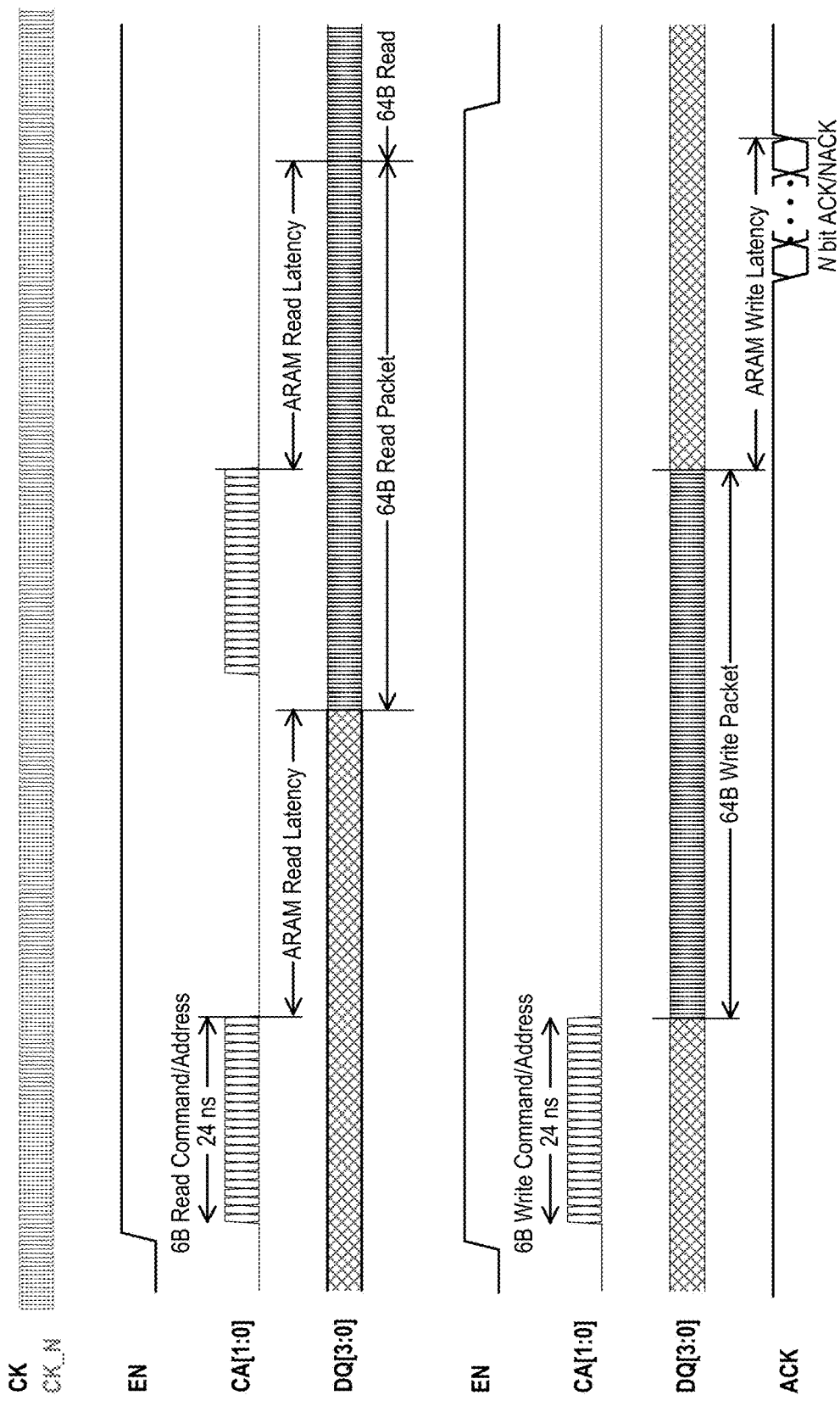
FIG. 5 illustrates an ARAM Protocol Format, according to an embodiment.

A sample sequencing of enable signals, command/address packets, data packets, and acknowledge/status signals is shown in FIG. 5. The sub-fields within the command/address packet are devoted to command type (e.g. read or write, device select, register or data address, data packet length, write mask, etc.) are described elsewhere. FIG. 5 illustrates the serialization of 48-bit command/address packets, for both back-to-back 64 B read data transactions and a 64 B write data transaction.

2.7 Supported ARAM Device Configurations
2.7.1 ARAM Core Organizations

Various core organizations can be supported by the ARAM interface architecture. An ARAM Controller can support the full architectural range, but the verification may be focused, based on system requirements or current ARAM implementations. At minimal power and area overhead, a memory controller with a wider range of architectural support eases the migration path to newer ARAM devices, as they become available.

2.7.2 DQ Dynamic Width Configuration

In one embodiment, the ARAM system architecture supports Dynamic Width configuration, allowing capacity expansion without degrading the channel bandwidth due to additional loading. When Dynamic Width data path multiplexing is enabled, the external width of the ARAM DQ link is reduced, and ARAM device data traffic is carried on a subset of the device's DQ pins. For a given system memory width, more memory devices can be connected to the CPHY, resulting in expanded memory capacity.

Table 4 lists the DQ configurations supported by the ARAM interface architecture. While the ARAM interface architecture supports the full range of possible Dynamic Width connectivity and configurability, both the complexity of the connectivity discovery sequence the controller must execute during initialization and the datapath logic within the ARAM device will be simplified if only the minimal initial configurations are implemented.

TABLE 4

ARAM Dynamic Width DQ Configurations
Supported Architecture Range

| Native | | Dynamic Width Configuration | |
|---|---|---|---|
| DQ Width | DQ Signals | DQ Width | Active DQ Signals |
| x4 ARAM | DQ[3:0] | x4 | DQ[3:0] |
| | | x2 | DQ[3:2] DQ[1:0] |
| | | x1 | DQ[3] DQ[2] DQ[1] DQ[0] |
| x8 ARAM | DQ[7:0] | x8 | DQ[7:0] |
| | | x4 | DQ[7:4] DQ[3:0] |
| | | x2 | DQ[7:6] DQ[5:4] DQ[3:2] DQ[1:0] |
| | | x1 | DQ[7] DQ[6] DQ[5] DQ[4] DQ[3] DQ[1] DQ[0] |

3 ARAM System Configuration

The ARAM interface architecture provides for a broad range of configurations, in order to meet application bandwidth, capacity, and latency requirements. This section illustrates a range of various memory system configurations that can be constructed using the ARAM interface architecture.

3.1 Example System Configurations

Table 5 lists a range of system configuration choices: each row is a specific system capacity (assuming 16 Gb ARAM devices), each column is the total number of ARAMs, the number of ranks, and the dynamic width mode. Note that the default for the Dynamic Width mode is the native device width (x4).

TABLE 5

Capacity, Ranks, and Dynamic Width Options

| Configuration | Capacity | ARAMs | Ranks | ARAM Dynamic Width |
|---|---|---|---|---|
| 1 | 2 GB | 1 | 1 | x4 |
| 2 | 4 GB | 2 | 2 | x4 |
| 3 | 8 GB | 4 | 2 | x2 |
| 4 | 16 GB | 8 | 2 | x1 |

3.2 Single Device, Single Rank

Figure 6:
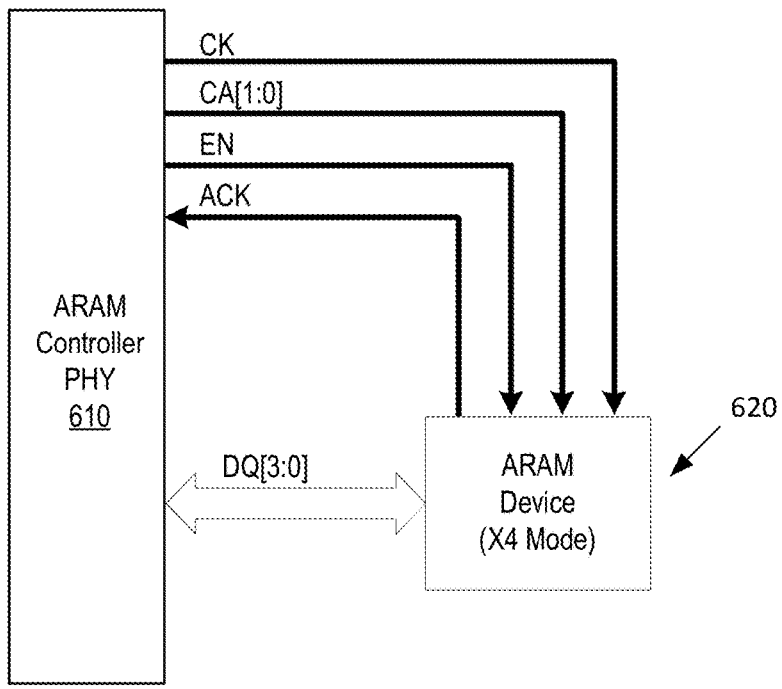
FIG. 6 illustrates a Single Device, Single Rank System (Dynamic Width Disabled), according to an embodiment.

FIG. 6 shows a x4 CPHY 610 that is connected to a single x4 ARAM component 620, according to an embodiment. This figure illustrates how the components of the memory system logically interact, without going into the details of each connection.

3.3 Two Devices, Dual Rank

Figure 7:
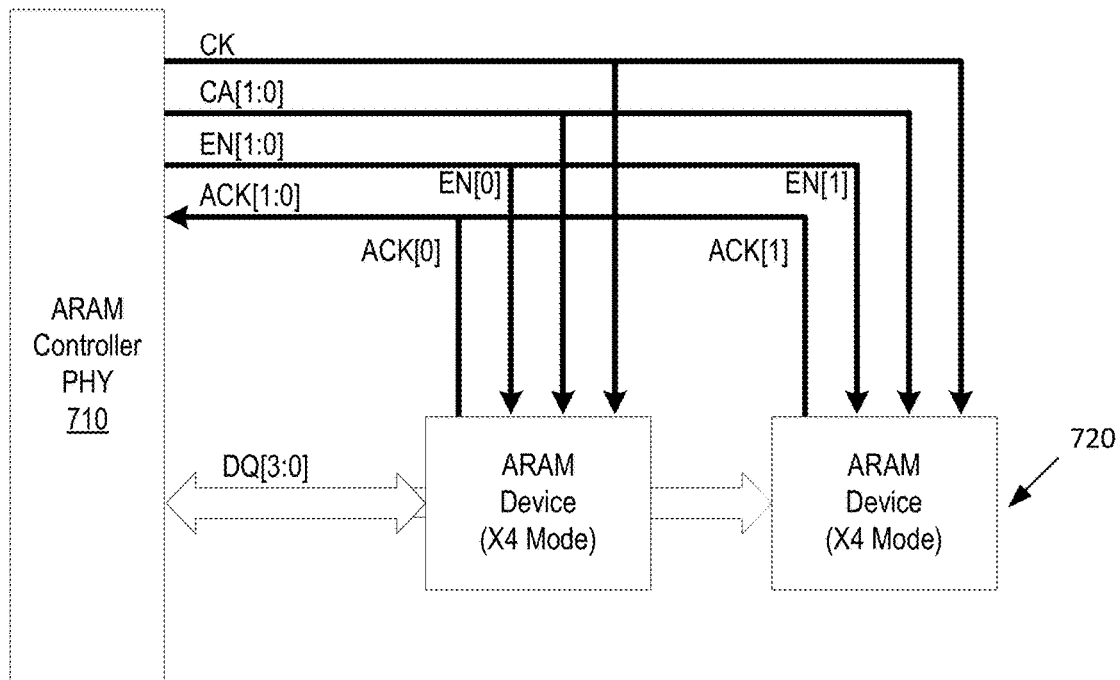
FIG. 7 illustrates a Two Device, Dual Rank System (Dynamic Width Disabled), according to an embodiment.

FIG. 7 shows a x4 CPHY 710 connected to two x4 ARAM devices 720 in separate ranks, according to an embodiment. The figure illustrates how the components logically interact, without going into the details of the individual connections. In one embodiment, the two ARAM components 720 share the same CK, CA and DQ links. Per-rank PHY power-down state is managed with separate EN lanes. CA packets include a sub-address field to target individual ranks. In this example, the controller has provisioned an ACK status lane for each rank.

3.4 Four Devices, Dual Rank, 4:2 Dynamic Width

Figure 8:
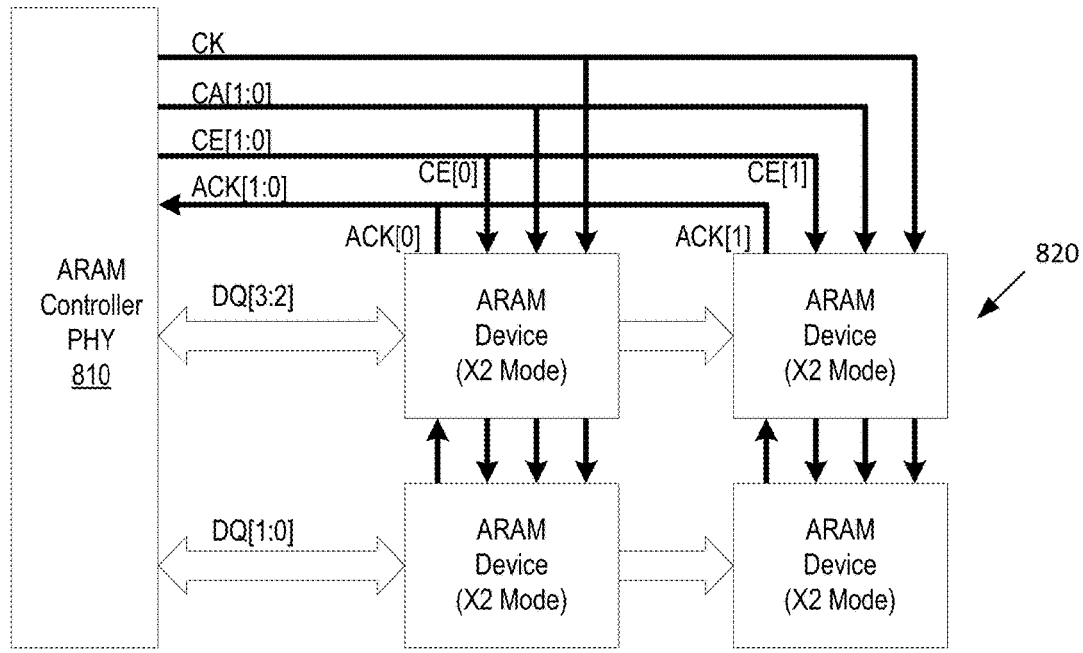
FIG. 8 illustrates a Four Device, Dual Rank System (4:2 Dynamic Width), according to an embodiment.

FIG. 8 shows a x4 CPHY 810 connected to a four x4 ARAMs 820, according to an embodiment. This figure illustrates how the components of the memory system logically interact, without going into the details of their connections. This configuration utilizes the Dynamic Width feature, which doubles the system memory capacity with the same system bandwidth. The x4 ARAMs 820 operate in x2 mode, with each ARAM providing half of the x4 wide data expected by the CPHY 810.

In one embodiment, the four ARAM components 820 share the same CK and CA links. Each ARAM component is configured in 4:2 dynamic width mode. Each of the two ARAM components (connected to different DQ lanes) within a rank share the same EN link. The ranks are selected by separate EN lanes, so that they can be independently placed into PHY power-down mode. During normal operation, the DQ data may be striped across the two components within the selected rank; the two components are operated in lockstep. Sub-address fields within the CA packet are used to address commands to individual components. In this example, one ACK status lane is shared by multiple memory devices within each rank.

With the Dynamic Width feature enabled and configured at power-on, only half of the DQ lanes on each ARAM device are active; the other half of the lanes are not used. This allows 2 ARAMs to replace a single ARAM; maintaining the same DQ loading and bandwidth as with a single ARAM, but with twice as much system memory capacity.

3.5 Eight Devices, Dual Rank, 4:1 Dynamic Width

Figure 9:
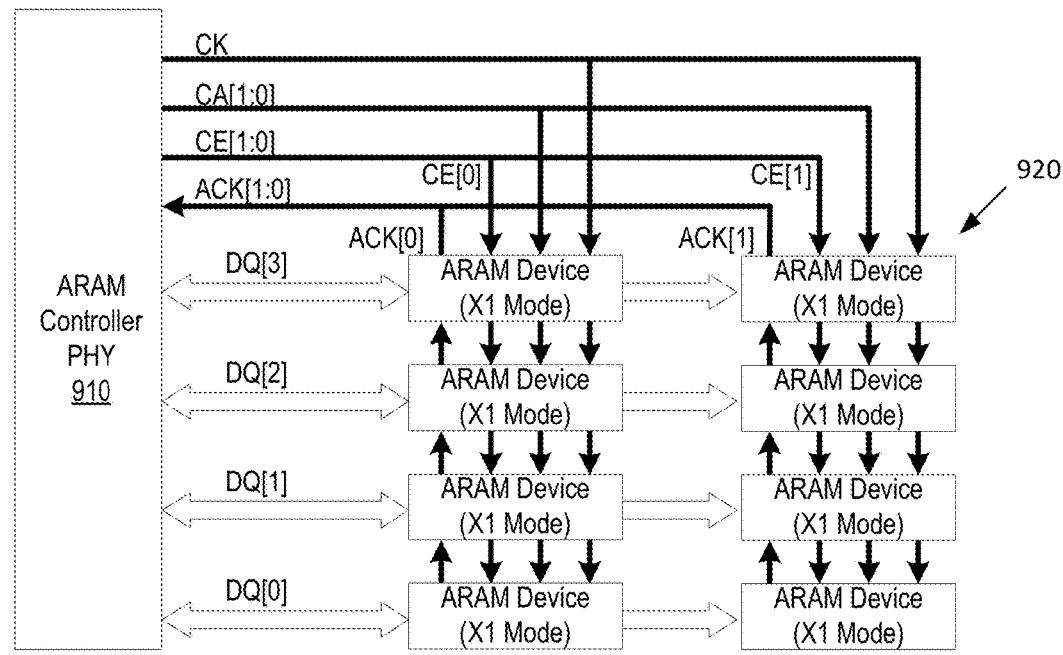
FIG. 9 illustrates an Eight Device, Dual Rank System (4:1 Dynamic Width), according to an embodiment.

FIG. 9 shows a x4 CPHY 910 connected to eight x4 ARAMs 920, according to an embodiment. This figure illustrates how the components of the memory system logically interact, without going into the details of their connections. This configuration utilizes the Dynamic Width feature, which provides 8 times the system memory capacity of a single ARAM device. The x4 ARAMs 920 operate in x1 mode, with each ARAM providing one quarter of the x4 wide data expected by the CPHY 910.

The eight ARAM components 920 share the same CK and CA links. Each ARAM component is configured in 4:1 dynamic width mode. All four of the x4 ARAM components (connected to different DQ lanes) within a rank share the same EN link. The ranks are selected by separate EN lanes, so that their operating power can be independently controlled. During normal operation, the DQ data is striped across the four components within the selected rank; the four components are operated in lockstep. Sub-address fields within the CA packet are used to address commands to individual components. In this example, one ACK status lane is also shared by multiple devices 920 within each rank.

With the Dynamic Width feature enabled and configured at power-on, only one of the DQ lanes on each ARAM device is active and the other three lanes are not used. This allows 4 ARAMs to replace a single ARAM within a rank; maintaining the same DQ loading and bandwidth as with a single ARAM, but with four times as much memory capacity. As this configuration has some ramifications with respect to signal integrity and hence data bandwidth, less than maximum data rates would be advised.

4 ARAM Interface Protocol and Serialization

This section describes the protocol used to communicate between the Controller and ARAM devices. It also describes the serialization of CA packets from the Controller PHY Link Layer interface to ARAM interface pins, their subsequent deserialization in the ARAM PHY, and their delivery to the ARAM PHY Link Layer interface.

4.1 CA Protocol

Figure 10:
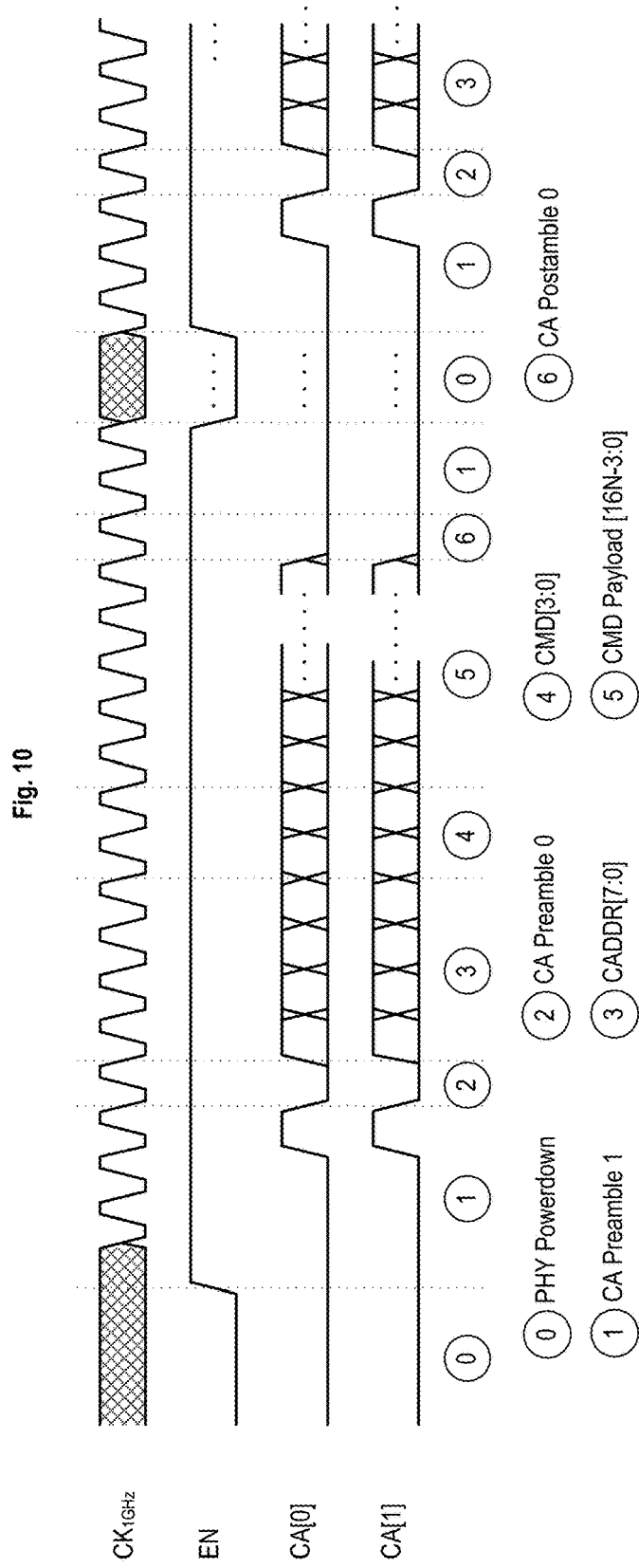
FIG. 10 illustrates Serialized CA Packet Waveforms, according to an embodiment.

When an ARAM device has been enabled with the assertion of the EN signal and the clocks started, the ARAM PHY will snoop the CA link searching for the preamble that delimits the start of a CA packet, as shown in the waveforms of FIG. 10.

In one embodiment, the minimum preamble duration is two CK cycles. Detection of malformed preambles can result in assertion of the ACK signal, and ignoring the remainder of a CA packet until the duration of the system defined maximum length command packet has been exceeded. Detection of a well formed preamble allows proper framing of the deserialized CA packet that the ARAM PHY outputs to the ARAM Link layer. Note that during the time interval after the assertion of EN and clocks, and prior to the detection of a preamble by the targeted device, the ARAM PCLK divider is free running.

Following the preamble, 8 bits (four CK cycles with two CA lanes) of command address (CADDR) information are serialized. Link layer logic within each ARAM will compare CADDR to the DEVADDR (device address) established during the initialization/configuration procedure to determine whether or not the command is targeted for the device. Partitioning the 8 bit CADDR field into two 4-bit subfields allows the broadcasting of command packets to up to 4 devices in up to 4 ranks. This use of the CADDR field enables the sharing of the CA link among multiple devices in different ranks, minimizing the total controller pin count. The ARAM PHY may choose to unconditionally accept commands that have CADDR=8'h00. It is the responsibility of the ARAM controller to schedule packets and transactions such that DQ driver conflicts are avoided.

The next 4 bits (2 CK cycles with two CA lanes) of the CA packet contain the command (CMD) field, allowing up to 16 distinct commands to be defined. Immediately following are 15 CK cycles (30 bits with two CA lanes) of command payload, whose length, contents, and semantics are specific to the particular command. CA packets are terminated with a 1 CK cycle postamble. The total CA packet length—including the pre and postambles—is 24 CK cycles (48 bits total) with two CA lanes. With an 8:1 serialization ratio, the Link-PHY interfaces will provide and receive CA packets in 3 PCLK cycles.

Figure 11:
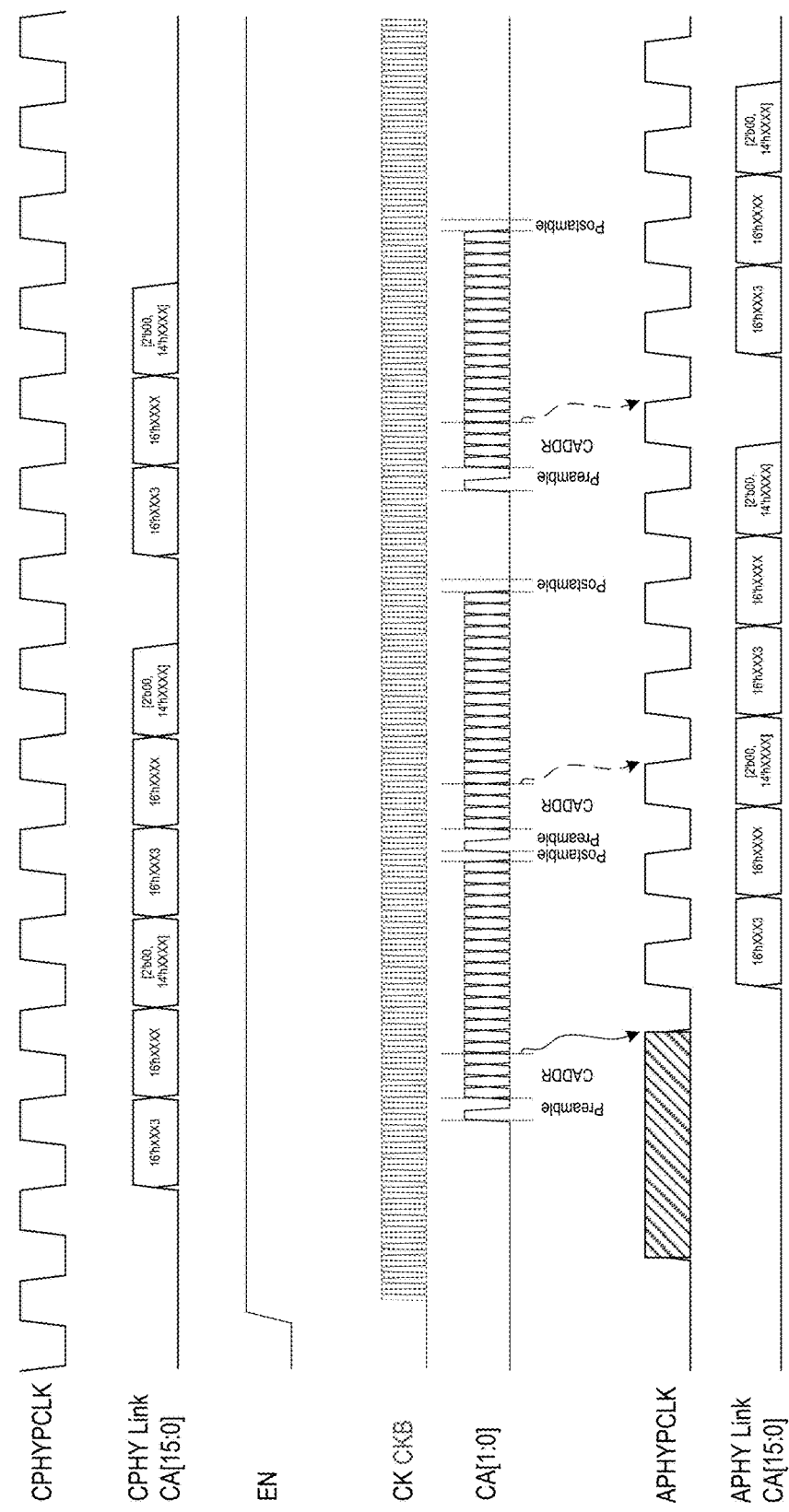
FIG. 11 illustrates CA Packet Serialization and Deserialization, according to an embodiment.

One embodiment of serialization of CA packets, from the ARAM Controller Link-CPHY interface, across the ARAM interface, and after deserialization, delivered to the ARAM APHY-Link interface, is shown in FIG. 11. The initial detection of a preamble after exiting the PHY Powerdown state is used to establish the phase of the APHY PCLK, which frames the deserialized CA and DQ data received by the ARAM device, and can remain unaltered as long as EN is asserted.

The ARAM Controller can ensure that the ARAM PHY CK and CA receivers and clock trees used to sample CA lanes have reached a stable operating condition prior to instructing that the CPHY serialize CA packets across the CA link. By idling the CPHY Link CA bus at 16h'0000, the packetized protocol with preamble detection will provide further protection against the consequences of CK glitching and sampling errors that can occur when exiting the PHY Powerdown state.

4.2 DQ Write Transactions

Figure 12:
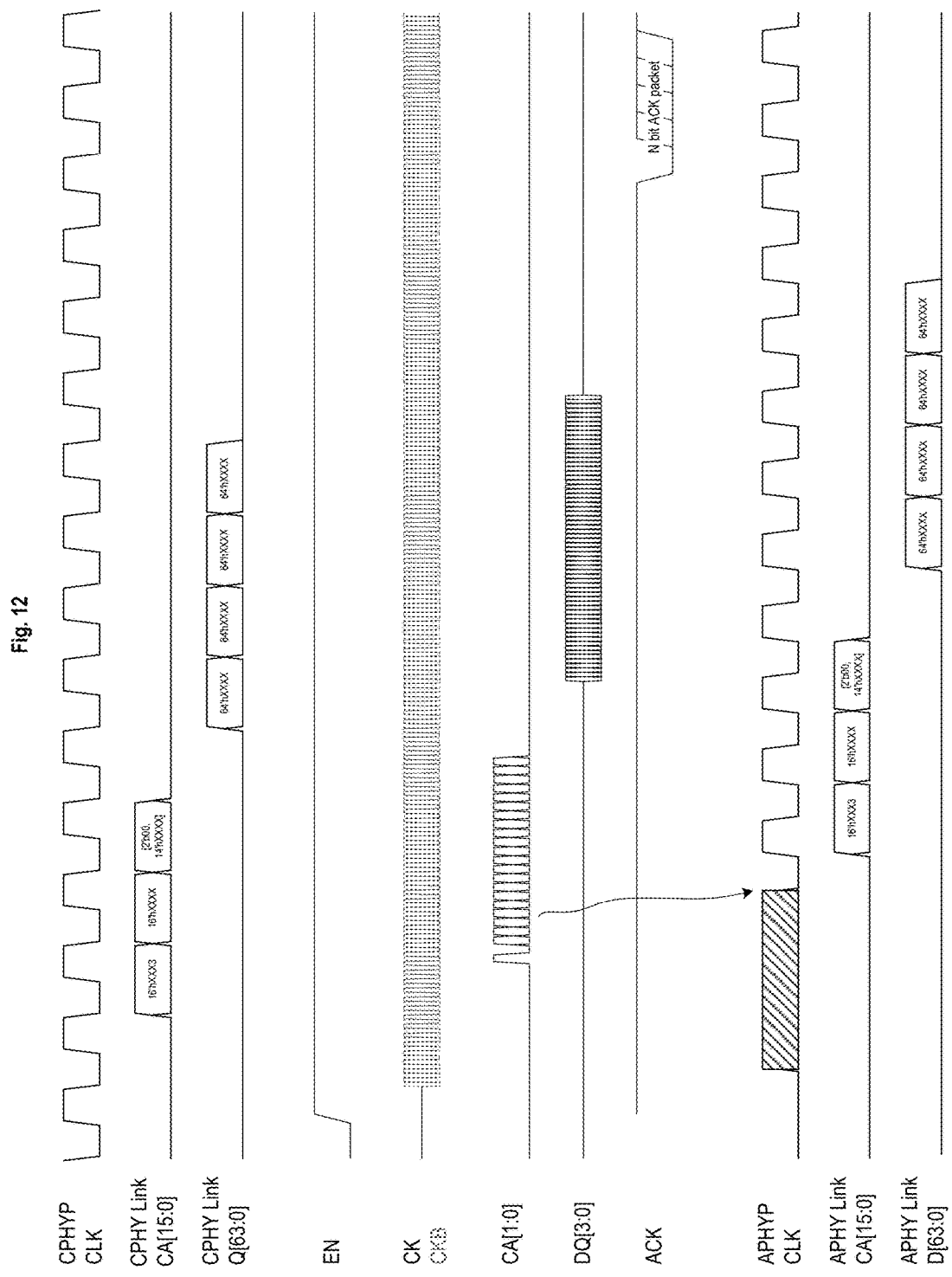
FIG. 12 illustrates a DQ Write Transaction, according to an embodiment.

FIG. 12 shows the timing for a write transaction in an ARAM system with a x4 Controller component connected to a x4 ARAM device, according to one embodiment. The timing diagram assumes that a two lane CA link (CA[1:0]) is used to convey the write command and address information to the ARAM. It also assumes that the ratio of the frequencies of the Controller and ARAM link layer clocks (PCLK) to the ARAM interface CK is 8:1. With DDR signaling, the DQ serialization ratio is 16:1, and with 4 DQ lanes, the natural width and granularity of PCLK domain DQ data is 64 bits.

The write transaction command from the ARAM Controller is first serialized in the CPHY and then driven onto the CA lanes with a delay of some period of time from the assertion of the parallel command to the assertion of the first serial CA bit. This delay includes a clock-domain-crossing component, from the internal parallel clock (PCLK) domain to the external clock (CK) domain.

At a time after driving the WR command, the ARAM Controller drives the Write Data (CPHY Link Q[63:0]). This data is then serialized by the CPHY at a 16:1 serialization ratio and driven onto the DQ links with a delay from the assertion of the first parallel data word to the assertion of the first serial DQ bit.

The phase of the ARAM PCLK used to frame deserialized CA data is established by the reception of the first CA packet received after the assertion of EN. The same phase of PCLK must also be maintained to frame deserialized DQ data. Consequently, it is the responsibility of the FlexPhase logic within the CPHY to launch data from the controller at the proper time, accounting for the cumulative static and dynamic path length differences between CA and DQ lanes, such that properly framed deserialized DQ data is delivered by the ARAM PHY to the ARAM Link Layer interface. Details of the calibration sequence of operations necessary to determine the proper delays within CPHY, to be applied on a per-ARAM device and per-rank basis, are described in Section 8.

Due to the limited endurance and variable write timing of ARAM cells, in one embodiment, all write DQ transactions are acknowledged. Positive acknowledgements of successfully committed write transactions are communicated back to the host in order to release write data that has been buffered upstream. Negative acknowledgement of unsuccessful write transactions can similarly be communicated back to the host in order to allow retrying the operation. The positive or negative acknowledgement information is returned to the host at a pre-determined time through the ACK lane. The ACK protocol is discussed in a subsequent section of this disclosure.

4.3 Read Transaction

Figure 13:
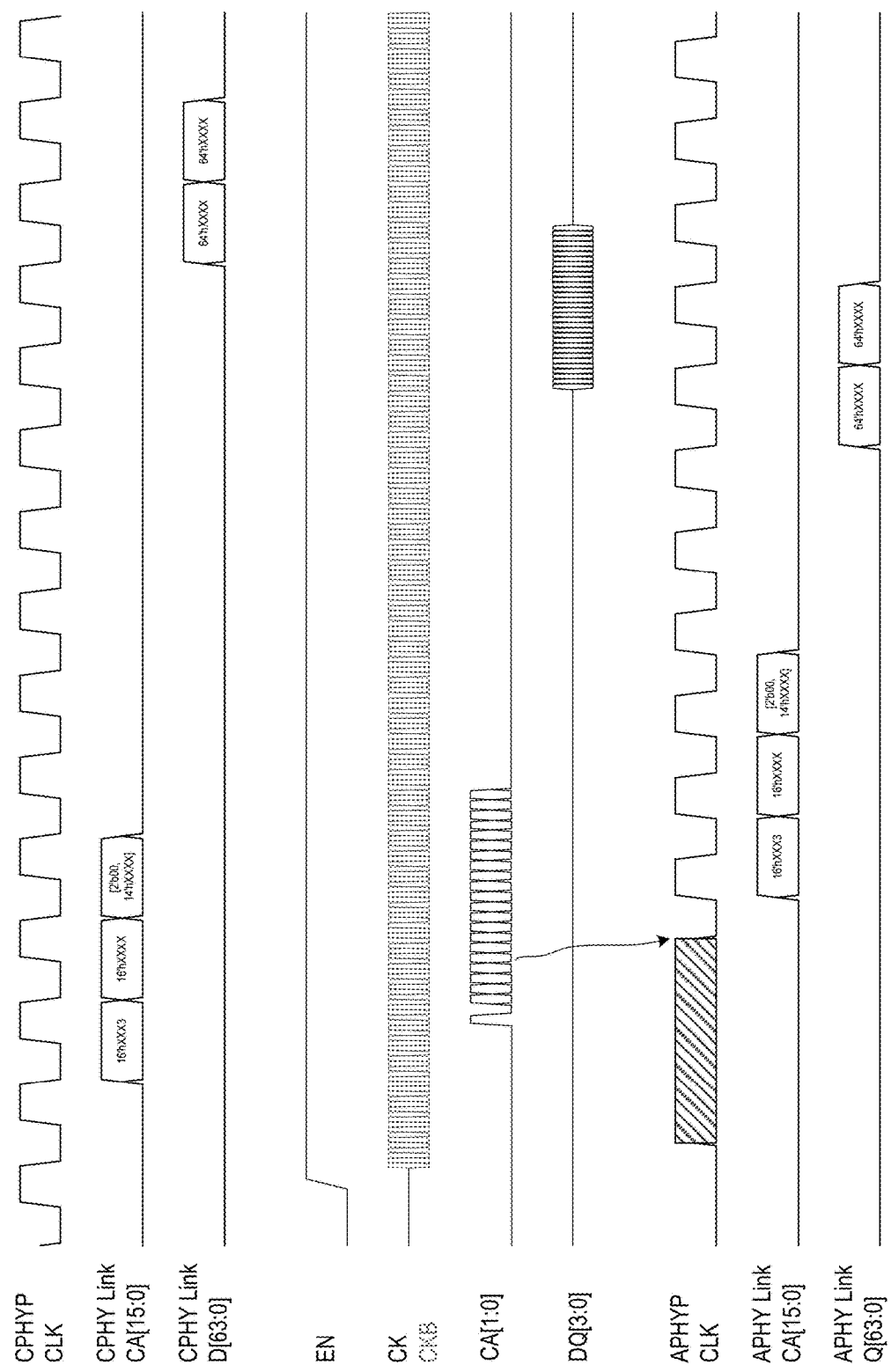
FIG. 13 illustrates a DQ Read Transaction, according to an embodiment.

FIG. 13 shows the timing for a read transaction in an ARAM system with a x4 Controller component connected to a x4 ARAM device, according to an embodiment. The timing diagram assumes that a two lane CA link (CA[1:0]) is used to convey the read command and address information to the ARAM. It also assumes that the ratio of the frequencies of the Controller and ARAM link layer clocks (PCLK) to the ARAM interface CK is 8:1. With DDR signaling, the DQ serialization ratio is 16:1, and with 4 DQ lanes, the natural width and granularity of PCLK domain DQ data is 64 bits.

The read transaction command from the ARAM Controller is first serialized in the CPHY and then driven onto the CA lanes with a period of delay from the assertion of the parallel command to the assertion of the first serial CA bit. This delay includes a clock-domain-crossing component, from the internal parallel clock (PCLK) domain to the external clock (CK) domain. At some time after receiving the RD command, the ARAM device link layer drives the Read Data (APHY Link Q[63:0]). This data is then serialized by the APHY at a 16:1 serialization ratio and driven onto the DQ links with a delay from the assertion of the first parallel data word to the assertion of the first serial DQ bit.

The phase of the ARAM PCLK used to frame deserialized CA data is established by the reception of the first CA packet received after the assertion of EN. The same phase of PCLK must also be maintained to frame deserialized DQ data. Consequently, it is the responsibility of the FlexPhase logic within the CPHY to sample data received from the ARAM at the proper time, accounting for the cumulative static and dynamic path length differences between CA and DQ lanes, ARAM read latency, and all clock domain crossings, such that properly framed deserialized DQ data is delivered by the ARAM Controller PHY to the ARAM Controller Link Layer interface. Details of the calibration sequence of operations necessary to determine the proper delays within CPHY, to be applied on a per-ARAM device and per-rank basis, are described in Section 8. It is assumed that the latency of read transactions is deterministic, and that acknowledgement via the ACK lane is not needed.

5 ACK Link Signaling and Protocol 5.1 Overview

In one embodiment, the ARAM interface includes a high-bandwidth, low-latency ACK link to provide a mechanism for ARAM devices to send status of outstanding operations back to the controller. For example, an ARAM device may need to notify the controller immediately after a WRITE operation has been successfully completed.

5.2 ACK Link Signaling

As described in Section 3 (ARAM System Configuration), each ARAM device may have one dedicated ACK pin. ARAM devices in the same rank can share an ACK link in order to reduce the controller pin count.

In one embodiment, wired-OR signaling is used in the shared ARAM link. Each ARAM device may drive an open-drain pull-down transistor to transmit a logic "1". The ARAM device may place the pull-down transistor in high-impedance (OFF) state to transmit a logic '0'. The ARAM controller is expected to provide termination in order to resolve the ACK signal. In one embodiment, each ARAM device drives the pull-down transistor to transmit a logic "1" as part of the ACK codes described below. If one ARAM device is pulling the line down, the line may have a first expected voltage value. If a second ARAM device is pulling the line down at the same time, the line may have a second expected voltage value, which is lower than the first expected voltage value. Since both ARAM devices are pulling the line in the same direction to transmit a logic "1" and not pulling the line at all to transmit a logic "0", the situation does not exist where two device are pulling the line in different directions, possibly canceling each other out and causing inaccurate readings at the controller.

In one embodiment, the nominal signaling rate of an ACK link is 1/4 of the CA signaling rate. For example, a system with 1 Gbps CA signaling rate may have a 250 Mbps ACK signaling rate.

5.3 ACK Link Protocol

Figure 14A:
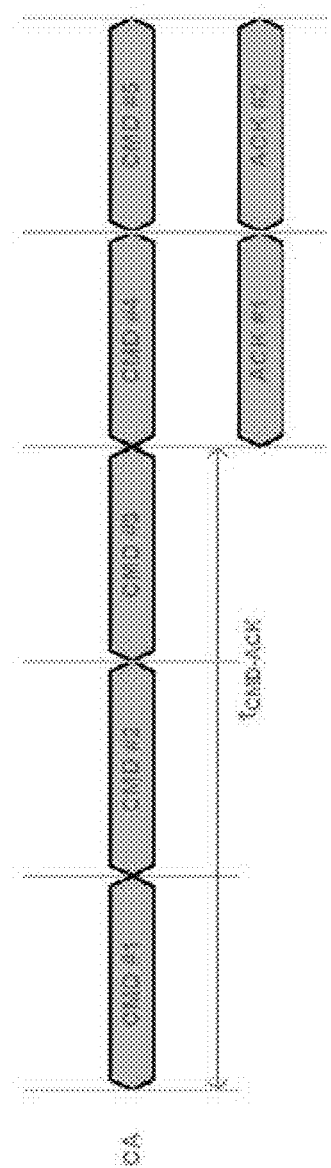
FIG. 14A illustrates a Transmission of ACK packet relative to incoming, according to an embodiment.

In one embodiment, an ARAM device sends back operation status information to the controller in the form of an ACK status packet. The transmission of an ACK status packet may be aligned to the clock signal CK. The length of an ACK status packet may be the same as the CA packet length. Because the ACK signaling rate is 1/4 of the CA signaling rate, the number of bits in an ACK packet may be 1/4 of the number of bits in a CA packet (e.g., for 24-bit CA packet, each ACK packet may be 6-bits long). FIG. 14A illustrates an ACK packet transmission by an ARAM device relative to incoming CA. The time between a CA preamble and the start of an ACK packet is labeled as tCMD-ACK. In one embodiment, there are two components of tCMD-ACK, as described below.

The first component is N*CA_PACKET_LENGTH, where N is an integer. Because this component is quantized to the CA packet length, it may scale with CK frequency. The integer N may be a variable. For example, if the command payload in the CA packet is a WRITE command, N may depend on the write latency of this particular instance. In the example illustrated in FIG. 14A, N=3.

The second component is some period of timing uncertainty, which is attributable to on-chip clock distribution and other causes of skew.

Figure 14B:
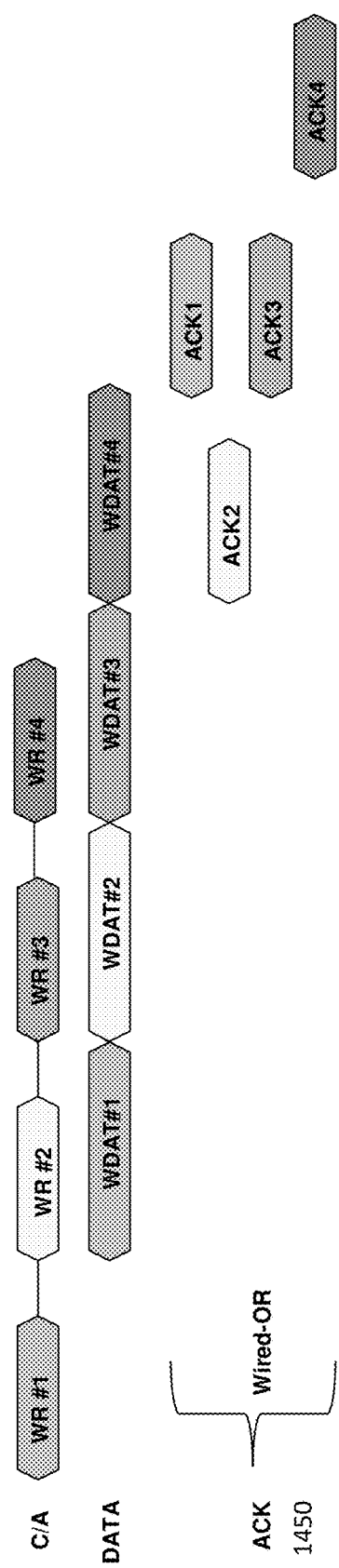
FIG. 14B illustrates a Transmission of multiple ACK packets on a shared ACK link, according to an embodiment.

FIG. 14B illustrates a transmission of multiple ACK packets on a shared ACK link, according to an embodiment. In one embodiment, each ARAM device is assigned a unique bit-sequence for use in ACK packets. The unique bit sequence may be based on a unique identifier of each device, for example. Each ARAM device can then transmit the unique bit sequence as an ACK packet to indicate the status of write operations received in a CA packet. The multiple packets can be wire-OR'd on the same ACK link and sent to the controller. The memory ARAM controller can decode the bit sequences to determine which ACK packet is received from which ARAM device. As shown in FIG. 14B, the ACK1 packet and ACK3 packet are send on the ACK link 1450 at the same time. In conventional systems, the two ACK packets would collide. In the present embodiment, however, the unique bit sequences in ACK1 and ACK2 allow the ARAM controller to correctly decode the two ACK packets send over ACK link 1450 at approximately the same time.

Figures 14C, 14D:
FIG. 14C illustrates different ACK packet codes for different memory devices, according to an embodiment.
FIG. 14D illustrates the possible wired-OR results for ACK packet codes, according to an embodiment.

FIG. 14C illustrates different ACK packet codes for different memory devices, according to an embodiment. In one embodiment, device 1 has a unique set of codes to signify pass, fail and NOP (no operation, i.e., no indication of acknowledgment is being sent). The codes may be a combination of logic values (in this case a 3-bit value for each). As illustrated, the codes are different from the code associated with device 2. In other embodiments, the codes may include some other number of bits or may have different logic values.

FIG. 14D illustrates the possible wired-OR results for ACK packet codes, according to an embodiment. In one embodiment, two of the codes shown in FIG. 14C (i.e., one from each device), may be send on the ACK link at the same time. The codes may be wired-OR'd together to form a single packet. For example, the first received result 1480 includes the value 1, 2, 2. The memory controller can decode this value to determine the corresponding codes for each memory device. For example, the received result 1, 2, 2 may decode to Device 1=0, 1, 1 (i.e. Pass) and Device 2=1, 1, 1 (i.e., Pass). Thus, both devices acknowledge the successful receipt of the command instruction. The remaining possible results in FIG. 14D may indicate other combinations of codes from Device 1 and Device 2.

Figure 15A:
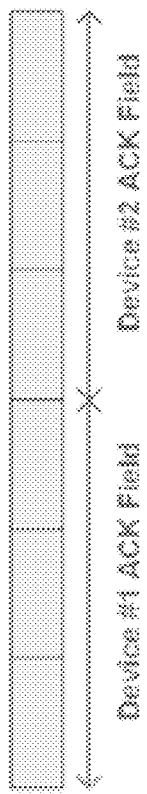
FIG. 15A illustrates an Example of 6-bit ACK packet having two 3-bit fields, according to an embodiment.

Because multiple devices in the same rank may share an ACK link and because ARAM devices may have variable write latency (i.e., the variable write latency is quantized to CA packet length as discussed above), ACK packets from the devices in the same rank may collide. To resolve this issue, an ACK packet may be divided into N fields (i.e., one field for each device) to avoid collision. In one embodiment, the assignment of ACK fields in an ACK packet is based on the Device ID. FIG. 15A describes an example of a system having two devices per rank. In the illustrated embodiment, there are two fields in one ACK packet (i.e., Device #1 ACK Field and Device #2 ACK Field), each field consisting of 3 bits. In this case, each ARAM device can transmit up to 3 status bits in an ACK packet.

Figure 15B:
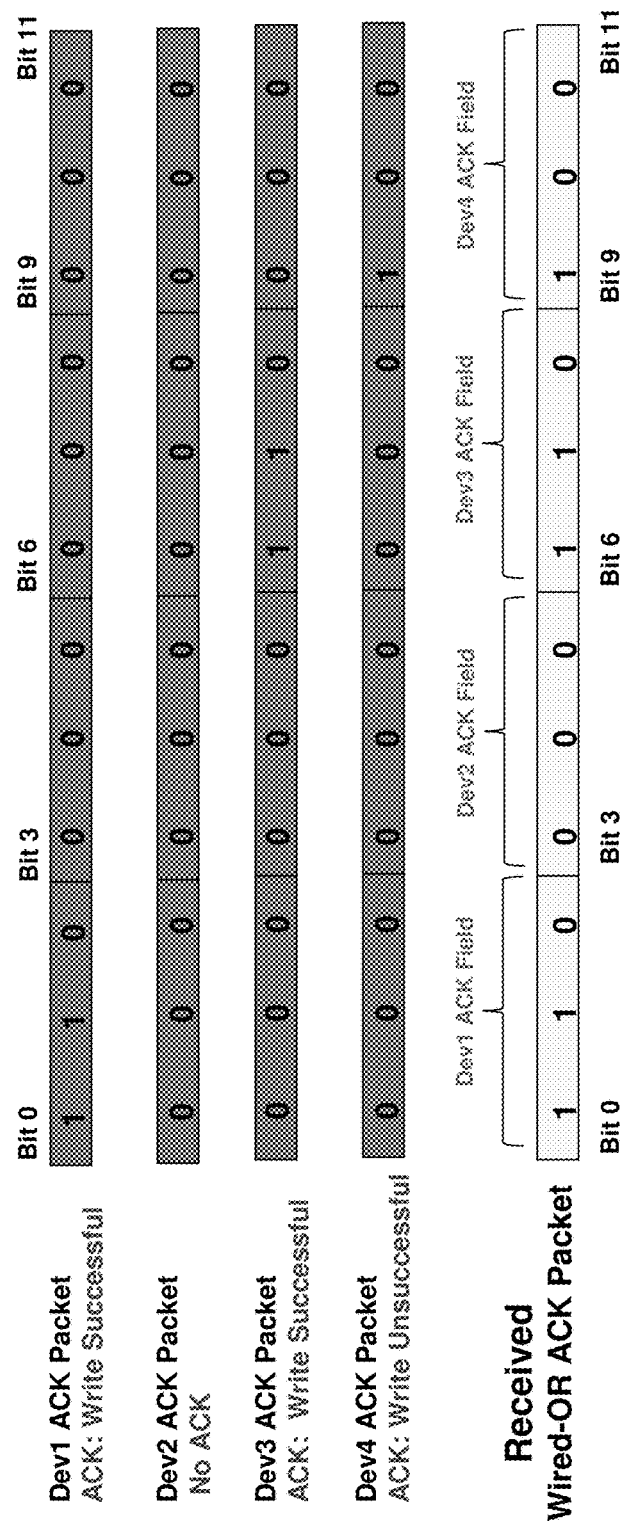
FIG. 15B illustrates an Example of a 12-bit ACK packet having four 3-bit fields, according to an embodiment.

FIG. 15B illustrates an Example of a 12-bit ACK packet having four 3-bit fields, according to an embodiment. In one embodiment, each of the 3-bit fields corresponds to a different ARAM device. Each ARAM device may transmit a full 12-bit ACK packet as shown. However, each ARAM device may only use a designated 3-bit field to include acknowledgment information, while the rest of the packet is full of values that do not perturb the ACK lane (e.g., all 0's). In one embodiment, bits 0-2 correspond to Dev1, bits 3-5 correspond to Dev2, bits 6-8 correspond to Dev3, and bits 9-11 correspond to Dev4. In one embodiment, when a device acknowledges a successful write, a logic value of 110 may be included in that device's corresponding ACK field. A logic value of 100 may indicate an unsuccessful write and a logic value of 000 may indicate no acknowledgment. In other embodiments, the ACK packet may have some other number of bits, some other number of fields, may have the fields assigned to different ARAM devices or may use different logic values. The four ACK packets (i.e., one from each ARAM device) may be wired-OR'd together to form the received wired-OR packet. The ARAM controller can examine the received wired-OR packet to identify what logic values are included in each ACK field to determine whether a particular operation was successful on each ARAM device.

Figure 16:
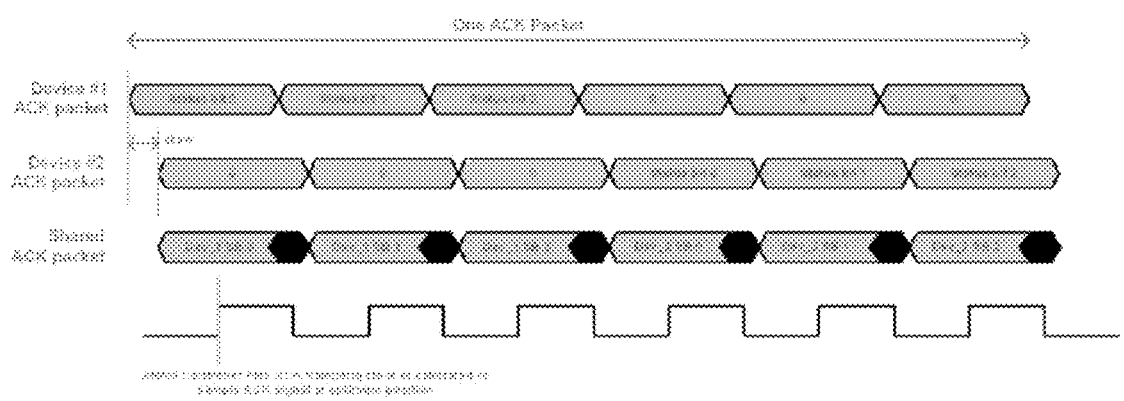
FIG. 16 illustrates the effect of skew on ACK link timing, according to an embodiment.

Because a single ACK link is shared by multiple devices using wired-OR signaling, there may be degradation in the quality of the ACK signal received by the controller. The degradation may be caused by on-chip clock distribution skew (and potentially package/board routing skews in some systems) among the devices sharing the ACK link. This issue is shown in FIG. 16. In one embodiment, in order to achieve an optimum sampling point, an ACK link calibration may be performed during initialization.

Figure 17:
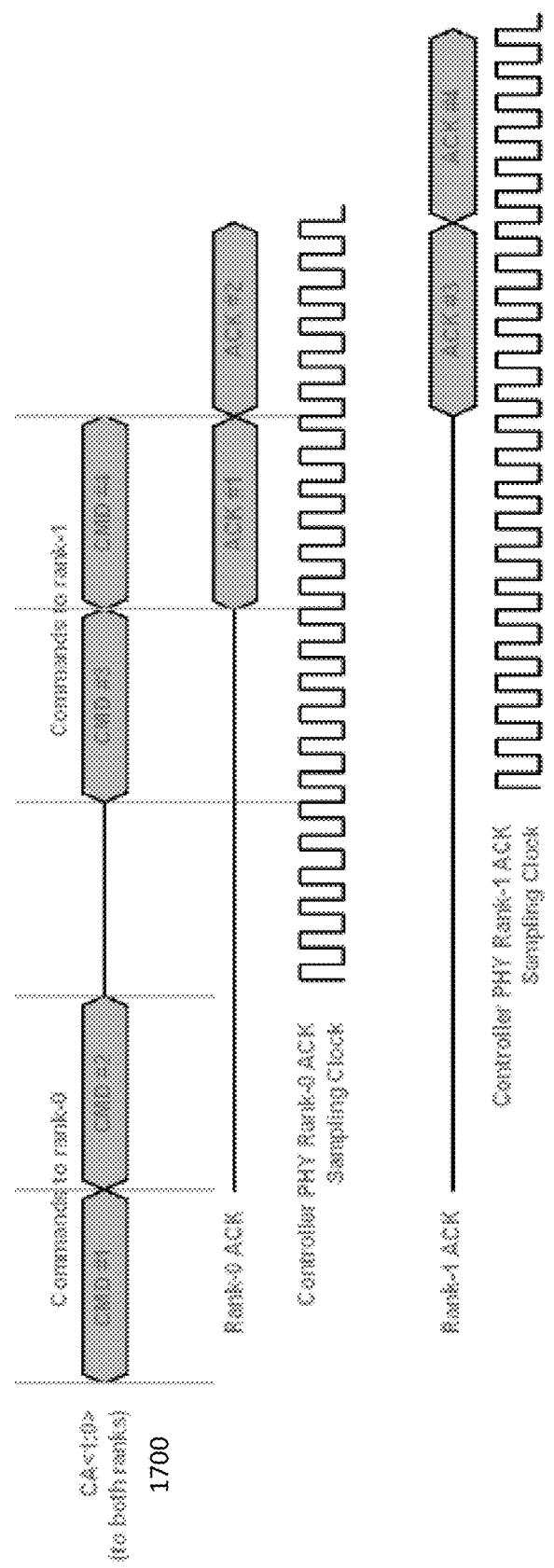
FIG. 17 illustrates an example ACK timing diagram for a two-rank system, according to an embodiment.

In two-rank systems, each rank may have its own dedicated ACK link as described above in Section 3 (ARAM System Configuration). An ACK protocol timing diagram for a two-rank system is described in FIG. 17. As shown in FIG. 17, the CA packet stream 1700 includes multiple commands (e.g., CMD #1, CMD #2, CMD #3, CMD #4). CMD #1 and CMD #2 are directed toward ARAM devices in rank-0 and CMD #3 and CMD #4 are directed to ARAM devices in rank-1. In one embodiment, the ARAM ranks are constrained in two ways. First, ACK packets are transmitted on a CA packet boundary. Second, ACK packets are returned in the same order as the CA packets were received at the memory device. In one embodiment, however, the particular CA packet boundary on which the ACK packet is returned is flexible. The boundary can change depending, for example on the type of command in the CA packet. Thus, the first ACK packet (i.e., ACK #1) is transmitted on the boundary between CMD#3 and CMD #4 (a delay of 3 packet lengths). The third ACK packet (i.e., ACK #3), however, which is sent by an ARAM device of rank-1 is transmitted on the boundary after CMD#4 (a delay of only 1 packet length). In addition, the controller sampling clocks can be different for each rank to compensate for the skew. As shown, the rank-0 sampling clock and the rank-1 sampling clock may have different frequencies and/or be out of phase.

6 Clocking and Datapath 6.1 Overview

Figure 18:
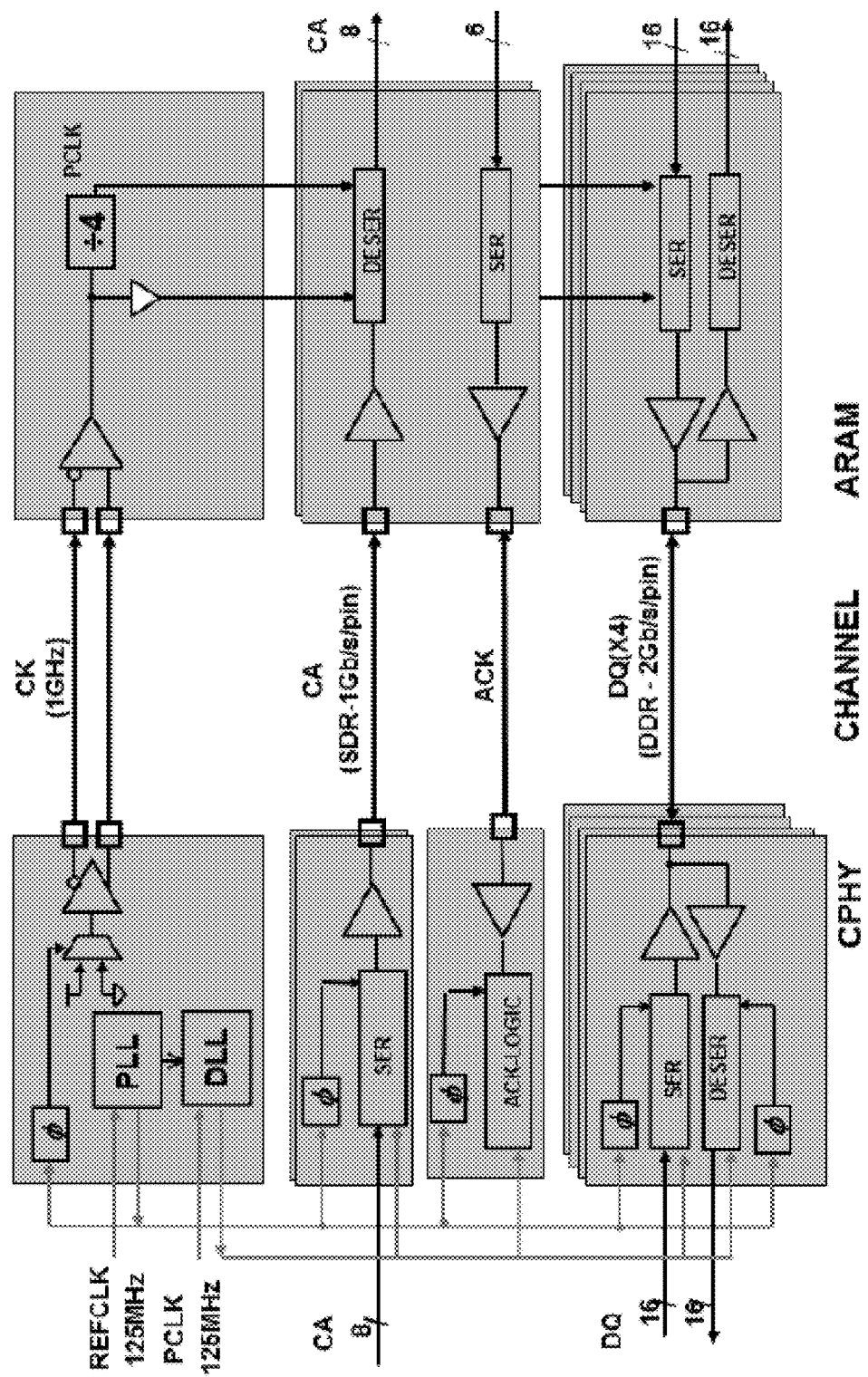
FIG. 18 illustrates a sample ARAM System Block Diagram, according to an embodiment.

This section provides a brief discussion on the clocking and datapath topology used in the ARAM interface architecture. FIG. 18 is a conceptual diagram illustrating an overview of the topologies utilized. Note that it is a Flex-phase-based system where the CPHY PLL generates a 1 GHz clock from a low speed reference. This clock is used by the Rx, Tx, serializing and deserializing circuitry within the CPHY, and is forwarded to the ARAM PHY for use there as a sampling and transmit clock as well as a source for the framing clock.

6.2 ARAM Device Clocking

Figure 19:
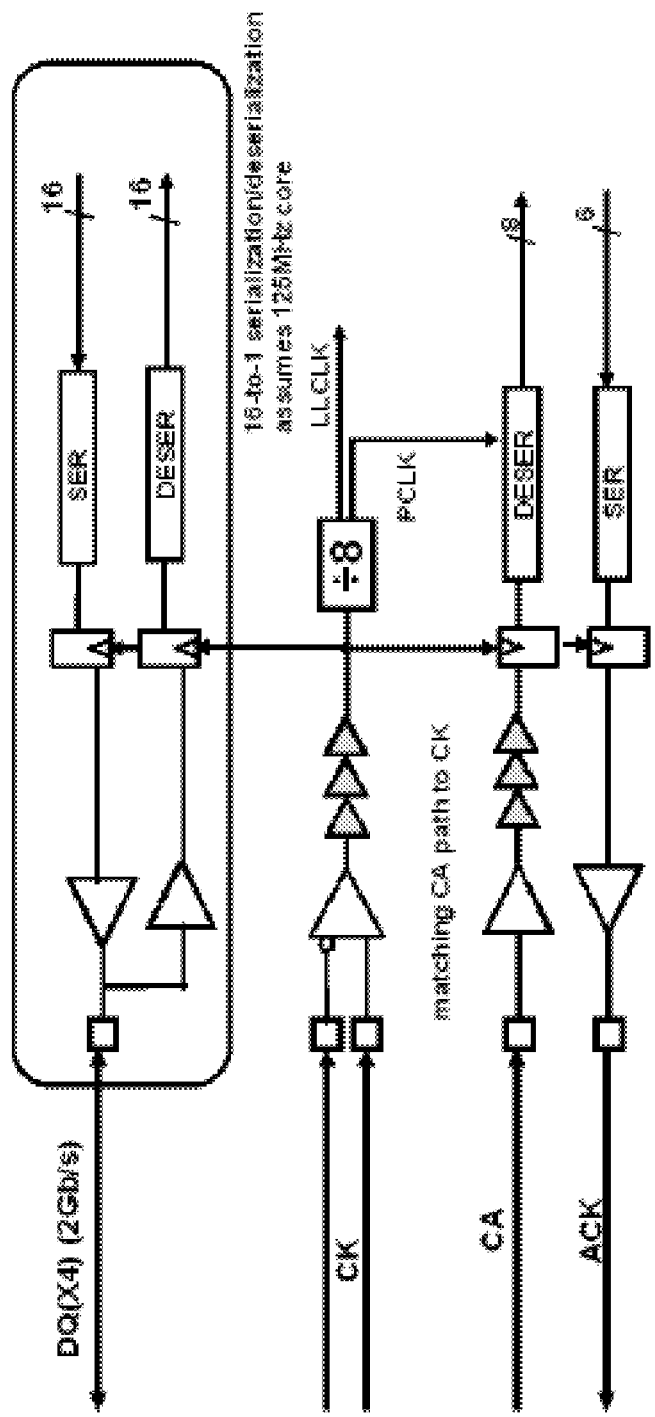
FIG. 19 illustrates ARAM Device Clocking, according to an embodiment.

The CK link signal forwarded from the controller PHY supplies the clocking waveform for the ARAM device. The signal comes in differentially, using VLS_NG levels. It is amplified to CMOS levels and then distributed across the interface. A divided-down version of this clock supplies the framing information for the serialization and deserialization function, while another version of the divided clock is sent to the Link Layer as its clock source. FIG. 19 illustrates a conceptual diagram of the internal clocking of an ARAM device, according to an embodiment. Note that the CK and CA input delay paths need to be matched as indicated on the diagram. This can allow the CPHY to communicate with all devices on its CA link without having to make a per-device CA-vs-CK phase adjustment, and is important for optimizing latency and efficiency of the command link.

Figure 20:
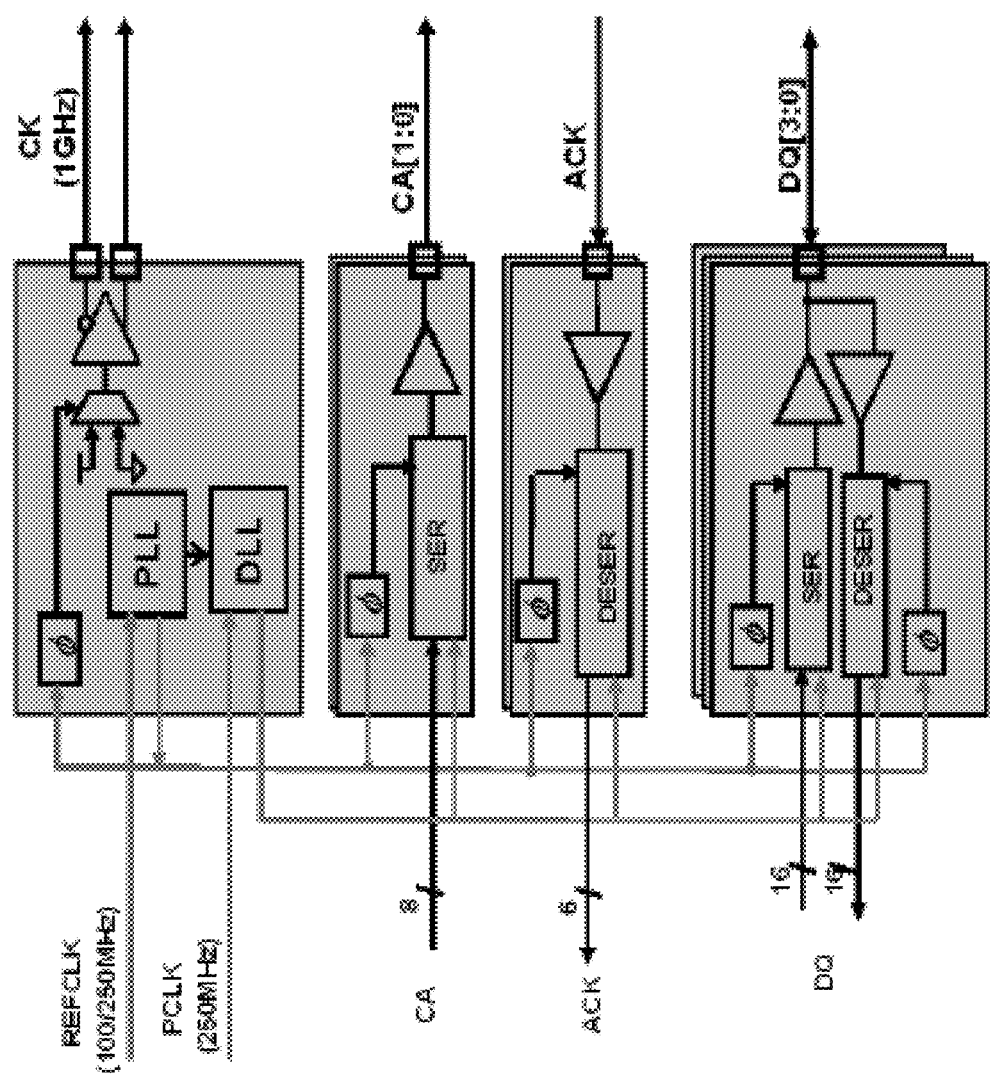
FIG. 20 illustrates ARAM CPHY Clocking, according to an embodiment.

FIG. 20 shows a conceptual diagram of the clocking internal to the ARAM CPHY, according to an embodiment. As indicated previously, the CPHY PLL takes a reference clock as an input (100/250 MHz) and multiplies it to create its 1 GHz output multi-phase clocks. A version of these clocks, through a phase mixer, is forwarded to the channel and eventually the ARAM device. The multi-phase clocks also serve as the input to the per DQ phase mixers which will generate the per DQ high speed clocks, used to clock the Rx/Tx/Serializer/Deserializer circuitry. Calibration at startup ensures that the phase placement of these clocks allow for sufficient and robust timing margins on the ARAM interface channel. A DLL serves to help synchronize the clock boundary crossing between the CPHY clock domain and the AMC clock domain (represented by the PCLK signal in the diagram). By retiming the data across the domains using the DLL and its output, latencies can be kept consistent and minimized. The PLL also needs to support a low-speed mode (e.g. REFCLK/2 mode) to enable communication with ARAM devices before the ARAM interface channel is fully calibrated at startup.

6.4 Calibration

The steps needed to calibrate the clocks within the ARAM interface architecture are discussed in the Initialization and Calibration section.

6.5 Starting and Stopping CK

When enabling/disabling an ARAM PHY through the EN signal or starting/stopping the forwarded CK link, it is important to take care not to create any glitches on the link which can propagate through the attached ARAM devices.

When starting or stopping the forwarded CK/CKB signals, the CPHY must assure that no runt pulses propagate down the channel. Any such pulses can corrupt the divider state within the ARAM PHY and could possibly cause a undefined clock to enter the logic blocks of the device. In order to meet this requirement, CPHY uses a synchronous clock-gating circuit to stop and start forwarded clock CK/CKB signals. Because EN signal assertion/deassertion is asynchronous and may happen when the forwarded clock is running (in multi-rank case for example), the ARAM PHY must guarantee that the glitches or runt pulses happen at its clock divider outputs. When the EN signal is deasserted to put an ARAM device in a low-power state, the ARAM PHY in the ARAM device sets its clock divider outputs to a known static state without glitch and then powers down its bias circuits including the bias circuit for the forwarded clock amplifiers. When EN signal is asserted, the bias circuits are enabled, the ARAM PHY will then wait for a CA preamble to restart its clock dividers.

7 Register Operations

The ARAM device registers are accessible in the INIT and ACTIVE modes. They can be accessed at BOOTMODE rates at any point, but can also be accessed at the full rate after the CA and DQ links are calibrated.

Writing to the registers can be executed entirely through the CA command packet, utilizing the WRT_REG command along with its payload of register address and contents.

Reading from the registers requires use of the CA link as well as the DQ link. The architecture has some flexibility as to which DQs will deliver the register contents, and this can be determined during implementation or can be made configurable.

8 Power-On, Initialization and Calibration

8.1 Overview

Before a powered down ARAM PHY can be used in normal operating mode, it may need to be powered-on and calibrated. The power-on and initial calibration sequence of an ARAM PHY may occur as follows:
1. Power-On Reset/INIT state
2. Device ID and Dynamic Width Assignment
3. VREF and Output Impedance Calibration
4. CLK DCC Calibration
5. CA Phase Calibration
6. DQ READ Phase Calibration and Leveling
7. DQ WRITE Phase Calibration and Leveling

8.2 Power-On Reset/INIT Mode:

As the supply regulators are being turned-on and the supply voltages are ramping, EN can be held low, while CK and the CA inputs must be held at a valid VLS-NG level. The DQ drivers power up in high impedance.

The power-on block within the interface will generate a self-timed reset pulse as the interface supply (VDD) finishes ramping. It is assumed that once the supplies are turned on, their final output voltages will be reached within tINIT0<a threshold amount of time. This reset pulse can place the ARAM PHY and Link Layer in their standard power-on reset condition which will be referred to as the INIT mode.

By asserting the EN signal after reset is complete, the PHY can begin operation at BOOTMODE datarates/frequencies.

Within the INIT state, all of the calibration commands will be enabled, allowing for any or all of the ARAM PHY calibration steps to be initiated. Other than Power-on reset, the INIT_MODE command can take the device from normal operation into INIT mode, while the command EXIT_INIT returns the device to standard operation. Other implementation options include using Register Writes to transition the device in and out of INIT mode

8.3 Device ID and Dynamic Width Assignment

After power-on reset has completed, in order to avoid the possibility of driver conflict, the controller can configure each of the ranks individually. Until all devices in all ranks have been configured, only one EN signal can be asserted at any one time.

When its EN signal is asserted, an ARAM PHY coming out of power-on reset is able to receive the CLK signal and decode commands from its CA inputs at BOOTMODE datarates. By loading a known pattern into internal registers and then reading it back out onto the devices, the system's connectivity can be determined, and each ARAM device can be assigned a Device ID. In addition, any dynamic width settings can also be assigned to each individual device at this time.

8.4 VREF and Output Impedance Calibration

After the assignment of DeviceIDs and Dynamic width settings, it is possible to initiate calibration of the reference voltage VREF and the output impedance on each device.

By sending a VREF_CAL command to a specific ARAM device, the controller can initiate VREF calibration on that device. Upon receiving and decoding this command, the ARAM Link Layer will enable the DQ receivers in the PHY and inhibit decoding of CA commands while it executes this VREF calibration command. The controller PHY will then set its VEXT voltage to its nominal (normal operation) level, followed by initiating its VREF calibration procedure. After the predetermined number of cycles have passed, the controller will stop sending its calibration procedure and the ARAM device's Link Layer will re-initiate its decoding of CA commands.

By sending a UP_IMP_CAL command to an ARAM device, the controller can initiate a pull-up impedance calibration command. The controller needs to set its DQ termination at the target impedance—e.g. 40 ohms—to ground. Upon receiving and decoding this command, the ARAM Link Layer will enable the DQ transmitters and have them transmit a DC (static) logical "1". By comparing the resulting voltage at the ARAM DQ pins to VEXT/2 the ARAM can adjust the pull-up impedance setting until it is properly calibrated to the desired value.

Similarly, by sending a DN_IMP_CAL command to an ARAM device, the controller can initiate a pull-down impedance calibration command. The controller needs to set its DQ termination at the target impedance to VEXT. Upon receiving and decoding this command, the ARAM Link Layer will enable the DQ transmitters and have them transmit a DC (static) logical "0". Comparing the resultant voltage at its DQ pins versus VEXT/2, the ARAM can adjust the pull-down impedance setting until it is properly calibrated to the desired target value.

8.5 Clock DCC Calibration

Calibrating out the duty cycle error in the clock distribution is initiated similarly to other calibration procedures, however it is a bit more involved since it requires a change in the frequency of operation (so that the duty cycle error with an "at-speed" clock can be corrected).

The procedure begins with the controller sending a CK_DCC command. The ARAM Link Layer, upon receiving and decoding this command, configures the ARAM PHY to measure the duty cycle of the internal clock waveform (and eventually send the measurement information to the Link Layer). After the PHY has been configured correctly, the controller will, without glitches, stop its clock (previously running at boot-mode rate) and restart it at the normal operation rate (e.g. 1 GHz). After a prescribed number of cycles (amounting to the time needed to do the DCC calibration) the controller will again glitchlessly stop its clock and restart it at the boot-mode frequency.

8.6 CA Phase Calibration

Now that the clock duty cycle has been calibrated, it is possible to begin phase calibration for the CAs and DQs. Note that CA calibration is intended to compensate for system-level skew between CAs and Clock (the internal delays associated with CK and CAs are assumed to be matched (i.e. CK and CAs are path matched internal to the ARAM device)).

CA calibration is initiated by the controller sending the CA_TCAL command to the ARAM device. In response, the Link Layer will inhibit the decoding of the packets on the CA link for a prescribed amount of time, and configure itself to compare the command payload to a known calibration pattern (previously stored in a register). In addition, the ARAM will be configured to send the result of the comparison back to the controller (via a non-CA channel, e.g. DQ0).

Once the ARAM is configured, the controller will again stop the bootmode rate CK and then restart CK at the nominal frequency. At this point, a standard FlexPhase based calibration can be executed, thereby optimizing timing for the CA link. After a prescribed amount of clock cycles, the phase calibration is assumed to have concluded and the ARAM will configure itself back to decoding CA packets.

8.7 DQ READ-Phase Calibration and Leveling

Discovery, address assignment, and dynamic width configuration have all been accomplished with static write DQ data. At this point, read DQ leveling can be performed. This may be accomplished with burst read operations of PRBS sequences, allowing the controller to determine the optimal per-device FlexPhase timings.

8.8 DQ Write-Phase Calibration and Leveling

Once robust DQ read timings have been established, the per-rank timing calibration of CA timing relative to CK can be performed. This can be facilitated by commands that request the ARAM device to return on the DQ bus data that was received in the payload of the CA packet.

Finally, once optimal CA and read DQ timings have been established, write DQ timing calibrations can be performed. The readback of the results of comparisons between write DQ data and expected data derived from either command payloads or internal PRBS logic enables determination of optimal controller per-rank, per-lane FlexPhase settings.

After the initial configuration and calibration has been completed, periodic calibrations may be performed to track changes in operating conditions as necessary.

8.9 ACK Phase Calibration

Each ACK link may require calibration to operate at its maximum rate. As indicated in the section discussing the ACK protocol, there are skews and delays that need to be accounted for to maximize receive timing for the ACK link. Similar to the other links, these are compensated for by adjusting the FlexPhase settings controlling the receive clock phase at the controller PHY.

The ACK link calibration can occur alongside the DQ calibration during initial calibration. By having all devices of a given rank transmitting a known pattern on its ACK link (at their assigned time slots), the controller will be able to discern a data eye, based on which the controller can adjust its ACK sampling clock edges to maximize timing margin. This step may need to be repeated for each rank (or can be done concurrently).

8.10 Additional Information

8.10.1 Device ID and Dynamic Width Assignment

A discussion of possible implementations of device identification and dynamic width assignment follows below. While complexities of solutions vary, what follows is believed to be a good compromise between system flexibility and straightforward design.

8.10.1.1 System topology, Device ID, and Dynamic Width Configuration

In many applications which utilize ARAM, the controller will not have access to an additional non-volatile memory resource that describes the rank and dynamic width connectivity of the attached ARAM devices. An example sequence of ARAM read and write operations and ARAM register resources that can be used for discovery is described in Section 8.10.1.2.

It is assumed that there is no persistent or non-volatile storage within the ARAM device that holds the device address mask field used to qualify CA packets. An example sequence of write operations and ARAM register resources that accomplish device address mask assignment are described in Section 8.10.1.3.

Finally, once connectivity of devices within a rank has been discovered and device address masks have been assigned, the required Dynamic Width DQ datapath de-multiplexing and multiplexing between the ARAM PHY and Link layers must be configured. An example sequence of operations that accomplishes this is described in Section 8.10.1.7.

8.10.1.2 System Topology

Without giving up the capacity scalability benefits of dynamic width, substantial reductions in the total number of operations and the conditional complexity that the controller must execute can be achieved by restricting the total number of allowed configurations. Reductions in the total amount of ARAM link layer datapath multiplexing will also result from restricting the possible configurations. For this reason, it is proposed that only the three connectivities on the DQ link shown in Table 6 be allowed:

TABLE 6

Reduced Set of Allowed Connectivities

| Controller | 1 ARAM/rank | 2 ARAMs/rank | 4 ARAMs/rank |
|---|---|---|---|
| DQ[3] | ARAM0 DQ[3] | ARAM1 DQ[1] | ARAM3 DQ[0] |
| DQ[2] | ARAM0 DQ[2] | ARAM1 DQ[0] | ARAM2 DQ[0] |
| DQ[1] | ARAM0 DQ[1] | ARAM0 DQ[1] | ARAM1 DQ[0] |
| DQ[0] | ARAM0 DQ[0] | ARAM0 DQ[0] | ARAM0 DQ[0] |

TABLE 7

Read Responses for Reduced Set of Allowed Connectivities

| 1 ARAM | 2 ARAMs | 4 ARAMs |
|---|---|---|
| DQ = 4'b0001 | DQ = 4'b0101 | DQ = 4'b1111 |

8.10.1.3 Device Address Assignment

In order to enable individual devices to respond to the broadcast CA packets, each ARAM device needs to be assigned a unique address mask field. This is accomplished by establishing unique correlations between information that is broadcast to all devices within CA payloads and information that is received by individual devices on their DQ pins.

It is assumed that all devices will respond to the command sent in a CA packet with CADDR[7:0]==8'h00, which provides a way to communicate with uninitialized and unconfigured devices. CADDR[7:0] also serves as the broadcast address.

It is proposed that the CA packet address field CADDR [7:0] be logically split in to two subfields, CARANK and CADEVICE, where CADDR[7:0]={CARANK[3:0], CADEVICE[3:0]}. Splitting the CADDR this way will support configurations of one to four ranks, with up to four devices per rank. Commands targeted for individual ranks, sets of ranks, and individual devices or sets of devices within ranks are addressed through one-hot encodings.

Within each ARAM device there is an 8-bit ADDRMASK register. CA packets are accepted by a device when (|(CADDR[7:4] & ADDRMASK[7:4]) & |(CADDR[3:0] & ADDRMASK[3:0]))|(CADDR==8'h00) is true.

In addition to the ADDRMASK register, device address assignment can be accomplished by populating a temporary results register TEMP with the results of a logical operation performed on CMD payload DQ data, and then copying the contents of TEMP to ADDRMASK. Specific details of how to assign device addresses for the three recommended (1 device, 2 device, and 4 device per rank) connectivity configurations follows.

8.10.1.4 Single x4 Device/Rank Address Assignment

Assigning an address to single device entirely populating a rank is straightforward. The controller will first broadcast a command WRITE_CP_TEMP that instructs the ARAM to write the desired RANK and DEVICE mask bits from the CMD Payload to TEMP. The controller will then issue a WRITE_TEMP_ADDRMASK command, which results in the ARAM device copying the contents of the TEMP register to the ADDRMASK register, committing the address assignment.

8.10.1.5 Dual x2 Dynamic Width Device/Rank Address Assignment

First, the TEMP register is initialized in each device by broadcasting a WRITE_CP_TEMP command with the CMD Payload==8'b{RANK[3:0], 4'b0000}, where RANK denotes the desired RANK. This is followed by a broadcast WRITE_CP_AND_DQ_TEMPL command, where the static value 4'b1001 is driven on the DQ bus, and the 4 least significant bits of the CMD Payload (CP)==4'b0011. As a result of this operation the ARAM can set TEMP[3:0]=CP [3:0] & DQ[3:0]. The ARAM device connected to controller DQ[3:2] device will have TEMP[3:0]=(4'b0011 & 4'bxx10), while the device connected to controller DQ[1:0] will have TEMP[3:0]=(4'b0011 & 4'b0001). Address assignment is then completed with the WRITE_TEMP_ADDRMASK command.

8.10.1.6 Quad x1 Dynamic Width Device/Rank Address Assignment

In this configuration, all ARAM devices will observe the DQ link identically. In order to assign unique device addresses, the contents of each devices TEMP register will need to be assembled one bit at a time. The bit-by-bit construction can be accomplished by specifying in the CMD Payload which bit of the TEMP register is to be set if there is a match between the broadcast CA pattern and the observed DQ. Execution of the WRITE_CP_AND_ DQ_TEMP_n command will result in the following TEMP [n]=|(CP[3:0] & DQ[3:0]) where both n and CP[3:0] are broadcast in the CA command payload. The complete sequence of broadcast (CADDR=8'h00) commands, command payload fields, and necessary to assign addresses within the enabled rank to four devices follows:

WRITE_CP_TEMP CP==8'b{RANK[3:0], 4'b0000}
WRITE_CP_AND_DQ_TEMP_n CP=={3'b000, 4'b0001}, DQ==4'b0001 (TEMP[0]=|(4'b0001 & DQ[3:0])
WRITE_CP_AND_DQ_TEMP_n CP=={3'b001, 4'b0001}, DQ==4'b0010 (TEMP[1]=|(4'b0001 & DQ[3:0])
WRITE_CP_AND_DQ_TEMP_n CP=={3'b010, 4'b0001}, DQ==4'b0100 (TEMP[2]=|(4'b0001 & DQ[3:0])
WRITE_CP_AND_DQ_TEMP_n CP=={3'b011, 4'b0001}, DQ==4'b1000 (TEMP[3]=|(4'b0001 & DQ[3:0])
WRITE_TEMP_ADDRMASK

It is assumed that power-on detection will initialize the ARAM devices into full native width mode (x4 mode for x4 devices, x8 for x8 devices). Once connectivity discovery and address assignment has been completed, each ARAM device can be configured to the appropriate DQ datapath mux width with a WRITE_CP_DQWIDTH command, where DQWIDTH=CP[3:0].

If the ARAMs include a full crossbar that allows complete flexibility of datapath routing between the PHY DQ and the link layer that need to be configured, this can be accomplished with a sequence of commands which, in their payload field, specify the required PHY DQ to link DQ mapping.

It is assumed that although an ARAM has been configured to a reduced DQ width, the granularity of accesses will remain unchanged. That is, when DQWIDTH=4'b0010 (x2 mode), each byte from a device will be serialized across 4 CK cycles.

Although there are a few possible implementations, the following is designed to cancel out any AC related variation and hence produce an accurate effective VREF value. After the controller sets VEXT to the desired value, it begins to transmit a half-rate clock pattern to the ARAM DQs. Using a low-pass filter, the ARAM must extract the common mode of the incoming signals and utilize that as the desired VREF value. The ARAM must compare this desired value to the internal VREF that it is using, and the Link Layer must adjust the setting on the internal VREF generator to move its voltage closer to the desired voltage. This step would iterate until the internal voltage has been adjusted to the same value as the desired target.

The power supplies ramp up in this sequence: VDDP, VDD, VDDIO, where VDDP (if necessary) is a boosted voltage power supply for ARAM core high power or high voltage resources, VDD is the power supply for the ARAM PHY and Link layer CMOS logic, and VDDIO is the supply used for the VLS-NG drivers and receivers.

The detection of the ramp of power (VDD and VDDIO, in particular) must initialize enough state within the ARAM PHY and Link layers to enter the PHY Powerdown state, and respond to subsequent CA packets once VEXT has stabilized and EN is enabled. At a minimum, this would entail making sure that at least one pair (rank and device) of CA packet address mask bits are enabled if the ARAM device does not implement detection of CADDR=8'h00 as an unconditional match.

8.10.1.7 Dynamic Width Configuration 8.10.1.8 VREF and Impedance Calibration
9 Low-Speed Mode Low speed mode can be utilized whenever the ARAM interface channel has not been calibrated for high speed operation, or at any time is in need of recalibration. With care, it can also be utilized even if the ARAM interface is calibrated, if low speed operation is desired.

Note that prior to the completion of initialization, CA write leveling, and DQ calibration, the controller will launch CA data relative to one edge of CK while the ARAM will sample CA with the opposite edge of CK, nominally providing maximum setup and hold margin for commands. Also note that initialization can be accomplished with static values being exchanged on the DQ bus, as described in Section 8.

To maintain framing synchronization between the controller and ARAM, it's probably best to de-assert and re-assert EN immediately after changing the frequency of CK, as the first CA packet received after the assertion of EN will be used to re-establish ARAM framing.

10 ARAM PHY and Interface Operating States

The ARAM interface architecture supports a means to powerdown the ARAM PHY for flexible power management. The operating states and the activity of the associated PHY power domains are described in Table 8.

TABLE 8

PHY and Interface Operating States

| Functional State | EN | Operating State |
| --- | --- | --- |
| Poweroff | N/A | No supply |
| Cal_Init | 0 | Powerup-reset enters this state. PHY is disabled by EN. Enabling the PHY places interface in the Cal_init |
| Cal_Init | 1 | Calibration and Initialization state All calibration and initialization commands are accessible in this state |
| Ready | 0 | PHY is disabled by EN. Enabling the PHY places interface in the Ready state (assumes calibration is valid). |
| Ready | 1 | Standard, calibrated operating mode. |

10.1 ARAM PHY Operating State Transitions

Figure 21:
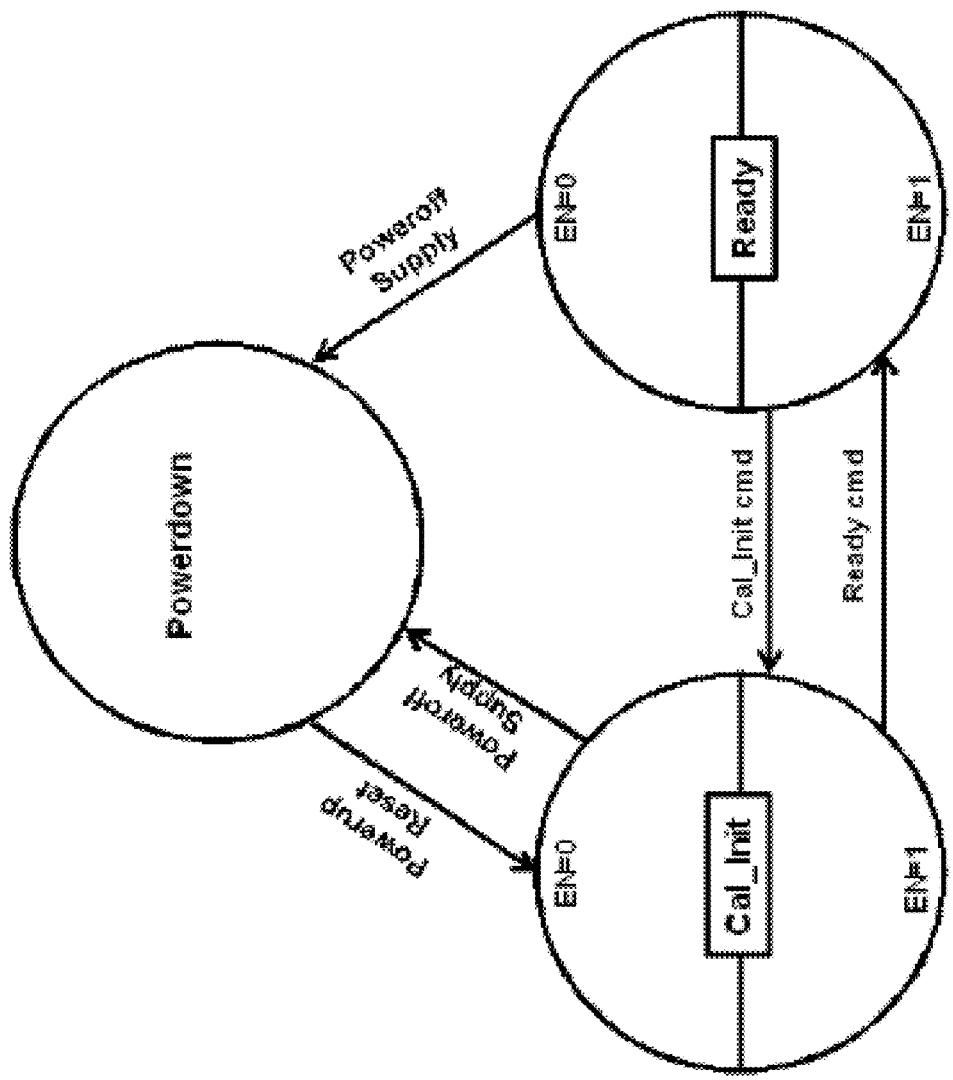
FIG. 21 illustrates ARAM PHY Operating State Transitions, according to an embodiment.

The transitions between the different operating states are shown in FIG. 21. During when the ARAM device is powered on, a power-on reset circuit will reset the state of the ARAM PHY and any additional circuitry necessary to enter the Cal_Init state. When the EN signal is asserted, the PHY will be able to receive and execute the necessary initialization and calibration commands from the CPHY.

The READY_ST command will place the PHY into the READY state, able to decode the standard CA commands. Similarly, the CAL_INIT_ST command will place the PHY into the Cal_Init state, able to accept any initialization and calibration commands. The controller needs to keep track of whether calibration is valid in either state and whether high data rate operation is possible or not.

The EN signal enables and disables the ARAM PHY, and hence needs to be asserted any time clocks are required within the ARAM device (including the Link Layer).

The algorithms and displays presented herein are not inherently related to any particular computer or other apparatus. Various general-purpose systems may be used with programs in accordance with the teachings herein, or it may prove convenient to construct a more specialized apparatus to perform the operations. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A method of operating a memory controller, the method comprising:
    sending, by the memory controller, a command to a first memory device;
    sending, by the memory controller, the command to a second memory device;
    receiving, by the memory controller at a single acknowledgment pin, an acknowledgment status packet over a shared acknowledgement link coupled between the single acknowledgment pin and the first and second memory devices, the acknowledgement status packet to indicate whether the command was received by the plurality of memory devices;
    identifying, by the memory controller, a first component of the acknowledgement status packet corresponding to the first memory device and a second component of the acknowledgement status packet corresponding to the second memory device; and
    determining, by the memory controller, that the first component of the acknowledgment status packet comprises a first value to indicate that the command was successfully received by the first memory device and that the second component of the acknowledgment status packet comprises a second value to indicate that the command was successfully received by the second memory device, wherein the first value is different than the second value.

2. The method of claim 1, wherein the first and second components are defined using different time slots in the acknowledgment status packet.

3. The method of claim 2, wherein identifying the first component and the second component comprises identifying the first value and the second value indicating a command status for corresponding memory devices, each value transmitted at a different time slot in the acknowledgment status packet.

4. The method of claim 1, wherein receiving the acknowledgment status packet comprises receiving a combination of acknowledgment status packets from the first and second memory devices, wherein the combination is a result of a wired-OR connection.

5. The method of claim 1, wherein receiving the acknowledgment status packet comprises receiving a combination of acknowledgment packet codes from the first and second memory devices, wherein the combination is a result of a wired-OR connection.

6. The method of claim 5, wherein each of first and second memory devices has a unique set of acknowledgment packet codes, the method further comprising:

determining which acknowledgment packet code is associated with each of the first and second memory devices.

7. The method of claim 1, wherein the first and second memory devices comprise advanced random access memory (ARAM) devices.

8. A memory controller device comprising:
a memory; and
a processing device operatively coupled to the memory, the processing device to:
send a command to a first memory device;
send the command to a second memory device;
receive, at a single acknowledgment pin, an acknowledgment status packet over a shared acknowledgement link coupled between the single acknowledgment pin and the first and second memory devices, the acknowledgement status packet to indicate whether the command was received by the plurality of memory devices;
identify a first component of the acknowledgement status packet corresponding to the first memory device and a second component of the acknowledgement status packet corresponding to the second memory device; and
determine that the first component of the acknowledgment status packet comprises a first value to indicate that the command was successfully received by the first memory device and that the second component of the acknowledgment status packet comprises a second value to indicate that the command was successfully received by the second memory device, wherein the first value is different than the second value.

9. The memory controller device of claim 8, wherein the first and second components are defined using different time slots in the acknowledgment status packet.

10. The memory controller device of claim 8, wherein to identify the first component and the second component, the processing device to identify the first value and the second value indicating a command status for corresponding memory devices, each value transmitted at a different time slot in the acknowledgment status packet.

11. The memory controller device of claim 8, wherein to receive the acknowledgment status packet, the processing device to receive a combination of acknowledgment status packets from the first and second memory devices, wherein the combination is a result of a wired-OR connection.

12. The memory controller device of claim 8, wherein to receive the acknowledgment status packet, the processing device to receive a combination of acknowledgment packet codes from the first and second memory devices, wherein the combination is a result of a wired-OR connection.

13. The memory controller device of claim 12, wherein each of first and second memory devices has a unique set of acknowledgment packet codes, the processing device further to:
determine which acknowledgment packet code is associated with each of the first and second memory devices.

14. The memory controller device of claim 8, wherein the first and second memory devices comprise advanced random access memory (ARAM) devices.

15. A method of operating a memory controller, the method comprising:
receiving a combined acknowledgment status packet over a shared acknowledgment link coupled to a single acknowledgment pin of the memory controller, the combined acknowledgement status packet comprising a first acknowledgment status packet corresponding to a first memory command and a first memory device and a second acknowledgement status packet corresponding to the first memory command and a second memory device; and
determining, by a processing device and based on a first value of the first acknowledgment status packet and a second value of the second acknowledgement status packet, that the first memory command was successfully received by the first memory device and by the second memory device, wherein the first value is different than the second value.

16. The method of claim 15, wherein the first and second memory devices have a same rank.

17. The method of claim 15, wherein the second acknowledgment status packet comprises at least one of a unique set acknowledgment packet codes associated with the second memory device, the packets codes each comprise a 3 bit value to indicate success, failure, or no operation of the first memory command.

18. The method of claim 17, wherein the first acknowledgment status packet is generated by pulling the shared acknowledgment link down by a predetermined amount to transmit a logic "1" and not pulling the shared acknowledgment link down to transmit a logic "0."

19. The method of claim 15, wherein the first and second acknowledgment status packets are assigned different time slots in the combined acknowledgment status packet corresponding to each of the first and second memory devices.

20. The method of claim 15, further comprising:
decoding the combined acknowledgment status packet to identify components of the combined acknowledgement status packet corresponding to each of the first and second memory devices.

* * * * *